(12) United States Patent
Chung et al.

(10) Patent No.: US 12,198,778 B2
(45) Date of Patent: Jan. 14, 2025

(54) MEMORY CONTROLLERS AND MEMORY SYSTEMS INCLUDING THE SAME

(71) Applicant: SAMSUNG ELECTRONICS CO., LTD., Suwon-si (KR)

(72) Inventors: Sungwoo Chung, Seoul (KR); Hyeongkon Bae, Seoul (KR); Myungjae Chung, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 17 days.

(21) Appl. No.: 18/351,709

(22) Filed: Jul. 13, 2023

(65) Prior Publication Data

US 2024/0170089 A1    May 23, 2024

(30) Foreign Application Priority Data

Nov. 17, 2022  (KR) .................. 10-2022-0154314
Jan. 6, 2023   (KR) .................. 10-2023-0002035

(51) Int. Cl.
  *G11C 29/52*    (2006.01)
  *G06F 11/10*    (2006.01)
  *G06F 13/16*    (2006.01)
  *G11C 11/408*   (2006.01)

(52) U.S. Cl.
  CPC .......... *G11C 29/52* (2013.01); *G06F 11/1048* (2013.01); *G06F 13/1668* (2013.01); *G11C 11/4087* (2013.01)

(58) Field of Classification Search
  CPC . G11C 29/52; G11C 11/4087; G06F 11/1048; G06F 13/1668
  USPC ........ 714/764, 768, 769, 773, 774, 799, 800
  See application file for complete search history.

(56) References Cited

U.S. PATENT DOCUMENTS

| | | | |
|---|---|---|---|
| 6,298,002 B1 | 10/2001 | Brooks et al. | |
| 9,826,067 B2 | 11/2017 | Bosshart et al. | |
| 9,842,022 B2* | 12/2017 | Motwani | G06F 11/1008 |
| 10,379,939 B2 | 8/2019 | Malladi et al. | |
| 10,802,908 B2* | 10/2020 | Pele | G06F 11/10 |
| 11,126,498 B2 | 9/2021 | Schaefer et al. | |
| 11,157,358 B2 | 10/2021 | Song et al. | |
| 11,507,456 B2 | 11/2022 | Song et al. | |
| 2013/0097470 A1* | 4/2013 | Hwang | H03M 13/35 714/E11.032 |

(Continued)

FOREIGN PATENT DOCUMENTS

| | | |
|---|---|---|
| CN | 102831028 A | 12/2012 |
| KR | 20210034726 A | 3/2021 |

*Primary Examiner* — John J Tabone, Jr.
(74) *Attorney, Agent, or Firm* — Myers Bigel, P.A.

(57) ABSTRACT

A memory controller that controls a memory module including a plurality of memory chips, the memory controller including an error correction circuit including an encoding circuit and a processor to control the error correction circuit. The encoding circuit, in a write operation, divides a user data set into data units, generates data flags indicating types of the data units, generates data parities based on the data units, generates flag parities based on the data flags, generates an encoded user data set by using at least one null data unit in which all or half of included data bits are zero, as a data duplication space for duplicating a valid data unit, generates a codeword set by interleaving the encoded user data set, the data parities, the data flags, the flag parities and a null bit bit-wisely, and transmits the codeword set to the memory module.

20 Claims, 21 Drawing Sheets

(56) References Cited

U.S. PATENT DOCUMENTS

| | | | |
|---|---|---|---|
| 2017/0206023 A1* | 7/2017 | Motwani | G06F 11/1008 |
| 2020/0042378 A1* | 2/2020 | Pele | G06F 11/1048 |
| 2021/0281280 A1* | 9/2021 | Jang | H03M 13/03 |
| 2024/0170089 A1* | 5/2024 | Chung | G11C 11/4087 |

* cited by examiner

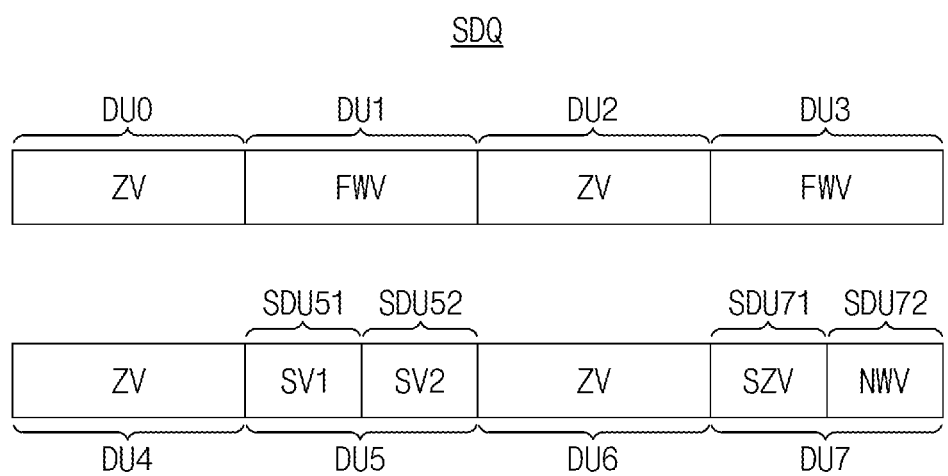

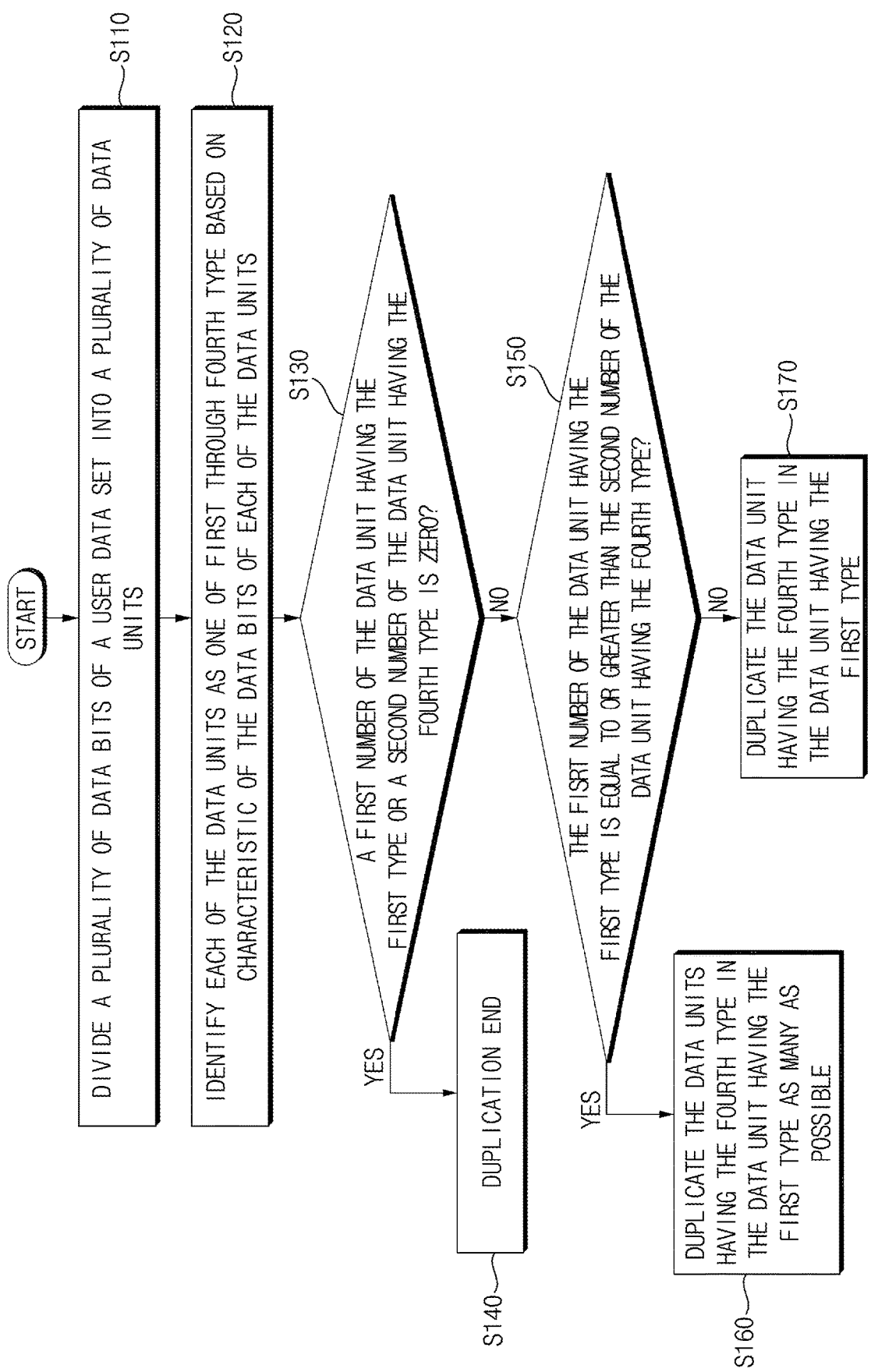

MEMORY CONTROLLERS AND MEMORY SYSTEMS INCLUDING THE SAME

CROSS-REFERENCE TO RELATED APPLICATIONS

This application claims priority under 35 USC § 119 to Korean Patent Application No. 10-2022-0154314, filed on Nov. 17, 2022, and to Korean Patent Application No. 10-2023-0002035, filed on Jan. 6, 2023, both in the Korean Intellectual Property Office (KIPO), and the entire contents of the above-identified applications are incorporated by reference herein.

TECHNICAL FIELD

Aspects of present disclosure relate to memories or memory devices, and more particularly, to memory controllers and memory systems including the same.

DISCUSSION OF THE RELATED ART

A memory device may be implemented using a semiconductor such as silicon (Si), germanium (Ge), gallium arsenide (GaAs), indium phosphide (InP), or the like. Memory devices are typically divided into volatile memory devices and nonvolatile memory devices.

A volatile memory device refers to a memory device in which data stored therein is lost when a power supply is shut down. On the other hand, a nonvolatile memory device refers to a memory device that retains data stored therein when a power supply is shut down. Because a dynamic random access memory (DRAM), which is a kind of volatile memory device, has a high access speed, the DRAM is widely used as a working memory, a buffer memory, a main memory, or the like of a computing system.

In addition, a plurality of volatile memory devices may be provided in the form of memory modules for providing a relatively large storage capacity. Thus, researchers are conducting various research projects of correcting errors occurring in the memory module with relative efficiency.

SUMMARY

Some example embodiments provide a memory controller capable of enhancing reliability of memory chips in a memory module.

Some example embodiments provide a memory system that includes memory controller capable of enhancing reliability of memory chips in a memory module.

According to some example embodiments, a memory controller is provided that is configured to control a memory module that includes a plurality of memory chips, with the memory controller including an error correction circuit and a processor to control the error correction circuit. The error correction circuit includes an encoding circuit. The encoding circuit, in a write operation, divides a user data set into a plurality of data units, each of which includes a plurality of data bits, identifies each of the plurality of data units as one of a plurality of types based on characteristic of the data bits thereof, generates data flags indicating the plurality of types, generates data parities by performing a first error correction code (ECC) encoding on the plurality of data units, generates flag parities by performing a second ECC encoding on the data flags, generates an encoded user data set by using at least one null data unit from among the plurality of data units as a data duplication space for duplicating a valid data unit from among the plurality of data units, generates a codeword set by interleaving the encoded user data set, the data parities, the data flags, the flag parities and a null bit bit-wisely, and transmits the codeword set to the memory module. The null data unit may be a data unit in which all or half of included data bits therein are zero and the valid data unit may be a data unit in which all or half of included data bits therein are valid According to some example embodiments, a memory system includes a memory module and a memory controller. The memory module may include a plurality of memory chips. The memory controller includes an error correction circuit and may be configured to control the memory module. The memory controller, in a write operation, divides a user data set into a plurality of data units, each of which includes a plurality of data bits, identifies each of the plurality of data units as one of a plurality of types based on a characteristic of the data bits thereof, generates data flags indicating the plurality of types, generates data parities by performing a first error correction code (ECC) encoding on the plurality of data units, generates flag parities by performing a second ECC encoding on the data flags, generates an encoded user data set by using at least one null data unit from among the plurality of data units as a data duplication space for duplicating a valid data unit from among the plurality of data units, generates a codeword set by interleaving the encoded user data set, the data parities, the data flags, the flag parities and a null bit bit-wisely, and transmits the codeword set to the memory module. The null data unit may be a data unit in which all or half of included data bits therein are zero and the valid data unit may be a data unit in which all or half of included data bits therein are valid.

According to some example embodiments, a memory controller to control a memory module including a plurality of memory chips by communicating with one or more host through a compute express link (CXL) interface, includes an error correction circuit and a processor to control the error correction circuit. The error correction circuit includes an encoding circuit and a decoding circuit. The encoding circuit, in a write operation, divides a user data set into a plurality of data units, each of which includes a plurality of data bits, identifies each of the plurality of data units as one of a plurality of types based on a characteristic of the data bits thereof, generates data flags indicating the plurality of types, generates data parities by performing a first error correction code (ECC) encoding on the plurality of data units, generates flag parities by performing a second ECC encoding on the data flags, generates an encoded user data set by using at least one null data unit from among the plurality of data units as a data duplication space for duplicating a valid data unit from among the plurality of data units, generates a codeword set by interleaving the encoded user data set, the data parities, the data flags, the flag parities and a null bit bit-wisely, and transmits the codeword set to the memory module. The decoding circuit, in a read operation, generates the encoded user data set, the data parities, the data flags and the flag parities by deinterleaving the user codeword set bit-wisely, read from the memory module, generates decoded data flags by performing a first ECC decoding on the data flags based on the flag parities and generates a decoded user data set by decoding the encoded user data set based on the data parities and the decoded data flags. The null data unit may be a data unit in which all or half of included data bits therein are zero and the valid data unit may be a data unit in which all or half of included data bits therein are valid Accordingly, the error correction circuit may generate an encoded user data set by using at least one null data unit in which all or half of included data bits are zero, from among the plurality of data units as a data duplication space for duplicating a valid data unit in which all or half of included data bits are valid, from among the plurality of data units, may generate a codeword set by interleaving the encoded user data set, the data parities, the data flags, the flag parities and a null bit bit-wisely and may store the codeword set in a memory module. In addition, the error correction circuit may correct errors by performing or operation on original data unit and duplicated data unit of the codeword set read from the memory module and may correct errors again by performing an ECC decoding. Therefore, the error correction circuit may enhance reliability of memory chips in the memory module.

BRIEF DESCRIPTION OF THE DRAWINGS

Illustrative, non-limiting example embodiments will be more clearly understood from the following detailed description taken in conjunction with the accompanying drawings.

FIG. 8 illustrates an example of the user data set in FIG. 7 according to some example embodiments.

FIG. 9 is a table illustrating data flags based on characteristics of a plurality of data units.

FIG. 10 is a flow chart illustrating an example operation of the encoding circuit of FIG. 7 according to some example embodiments.

DETAILED DESCRIPTION OF THE EMBODIMENTS

Figure 1:
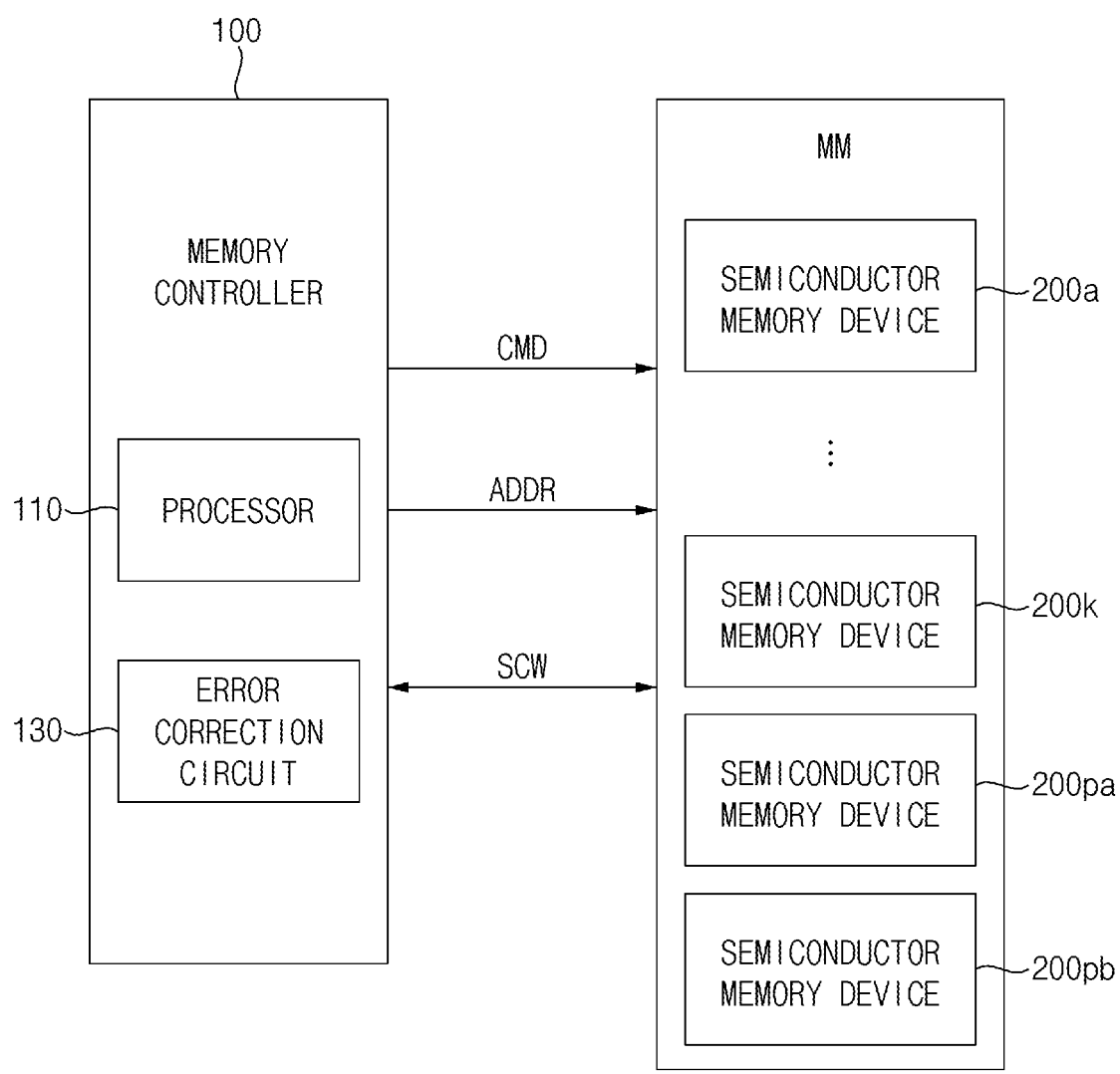
FIG. 1 is a block diagram illustrating a memory system, according to some example embodiments.

Some examples of embodiments of the present disclosure will be described more fully hereinafter with reference to the accompanying drawings. Like reference numerals may refer to like elements throughout the accompanying drawings.

FIG. 1 is a block diagram illustrating a memory system according to some example embodiments.

Referring to FIG. 1, a memory system 20 may include a memory controller 100 and a memory module MM. The memory module MM may include a plurality of semiconductor memory devices 200a~200k, 200pa and 200pb. Hereinafter, the plurality of semiconductor memory devices 200a~200k, 200pa and 200pb may be referred to as a plurality of memory chips. The plurality of memory chips 200a~200k, 200pa and 200pb may include a plurality of data chips 200a~200k, a first parity chip 200pa, and a second parity chip 200pb. In example embodiments, k may be 16, but the present disclosure is not limited thereto.

The memory controller 100 may control an overall operation of the memory system 20. The memory controller 100 may control an overall data exchange between a host (not shown) and the plurality of memory chips 200a~200k, 200pa and 200pb. For example, the memory controller 100 may write data in the plurality of memory chips 200a~200k, 200pa and 200pb and/or read data from the plurality of memory chips 200a~200k, 200pa and 200pb in response to a request from the host. In addition, the memory controller 30 may issue operation commands to the plurality of memory chips 200a~200k, 200pa and 200pb for controlling the plurality of memory chips 200a~200k, 200pa and 200pb.

In some example embodiments, each of the plurality of memory chips 200a~200k, 200pa and 200pb includes volatile memory cells such as a dynamic random access memory (DRAM).

In some example embodiments, each of the data chips 200a~200k may be referred to as a data memory, and each of the parity chips 200pa and 200pb may be referred to as an error correction code (ECC) memory, or a redundant memory.

The memory controller 100 may transmit an address ADDR and a command CMD to the memory module MM and may exchange a codeword set SCW with the memory module MM.

The memory controller 100 may include a processor 110 and an error correction circuit 130.

The processor 110 may control overall operation of the memory controller 100 and may control the error correction circuit 130.

The error correction circuit 130, in a write operation, may divide a user data set into a plurality of data units, each of which includes a plurality of data bits. The error correction circuit 130 may identify each of the plurality of data units as one of a plurality of types based on characteristic of the data bits of the each of the plurality of data units. The error correction circuit 130 may generate data flags indicating the plurality of types, may generate data parities by performing a first error correction code (ECC) encoding on the plurality of data units, may generate flag parities by performing a second ECC encoding on the data flags, may generate an encoded user data set by using at least one null data unit in which all or half of included data bits are zero, from among the plurality of data units. The at least one null data unit may be used as a data duplication space for duplicating a valid data unit in which all or half of included data bits are valid, from among the plurality of data units. The error correction circuit 130 may generate a codeword set by interleaving the encoded user data set, the data parities, the data flags, the flag parities and a null bit bit-wisely and may transmit the codeword set to the memory module MM.

The decoding circuit 440, in a read operation, may generate the encoded user data set, the data parities, the data flags and the flag parities by deinterleaving the user codeword set bit-wisely, read from the memory module MM, may generate decoded data flags by performing a first ECC decoding on the data flags based on the flag parities and may generate a decoded user data set by decoding the encoded user data set based on the data parities and the decoded data flags.

Because the error correction circuit 130 interleaves the encoded user data set, the data parities, the data flags, the flag parities and the null bit bit-wisely in the write operation, consecutive 18 bits in the codeword set SCW may be stored in each of the plurality of memory chips 200a~200k, 200pa and 200pb and an original data bit and a duplicated data bit may be stored in different memory chips, data parities corresponding to two data units may be stored in different memory chips, each half of the data flags may be stored in different memory chips and each half of the flag parities may be stored in different memory chips. Therefore, when errors occur in one memory chip, the original data bit may be recovered by performing OR operation on the original data bit and the duplicated data bit and the original data bit is robust to errors and one error is detected in half of the data flags and in half of the flag parities and the error may be corrected.

Figure 2:
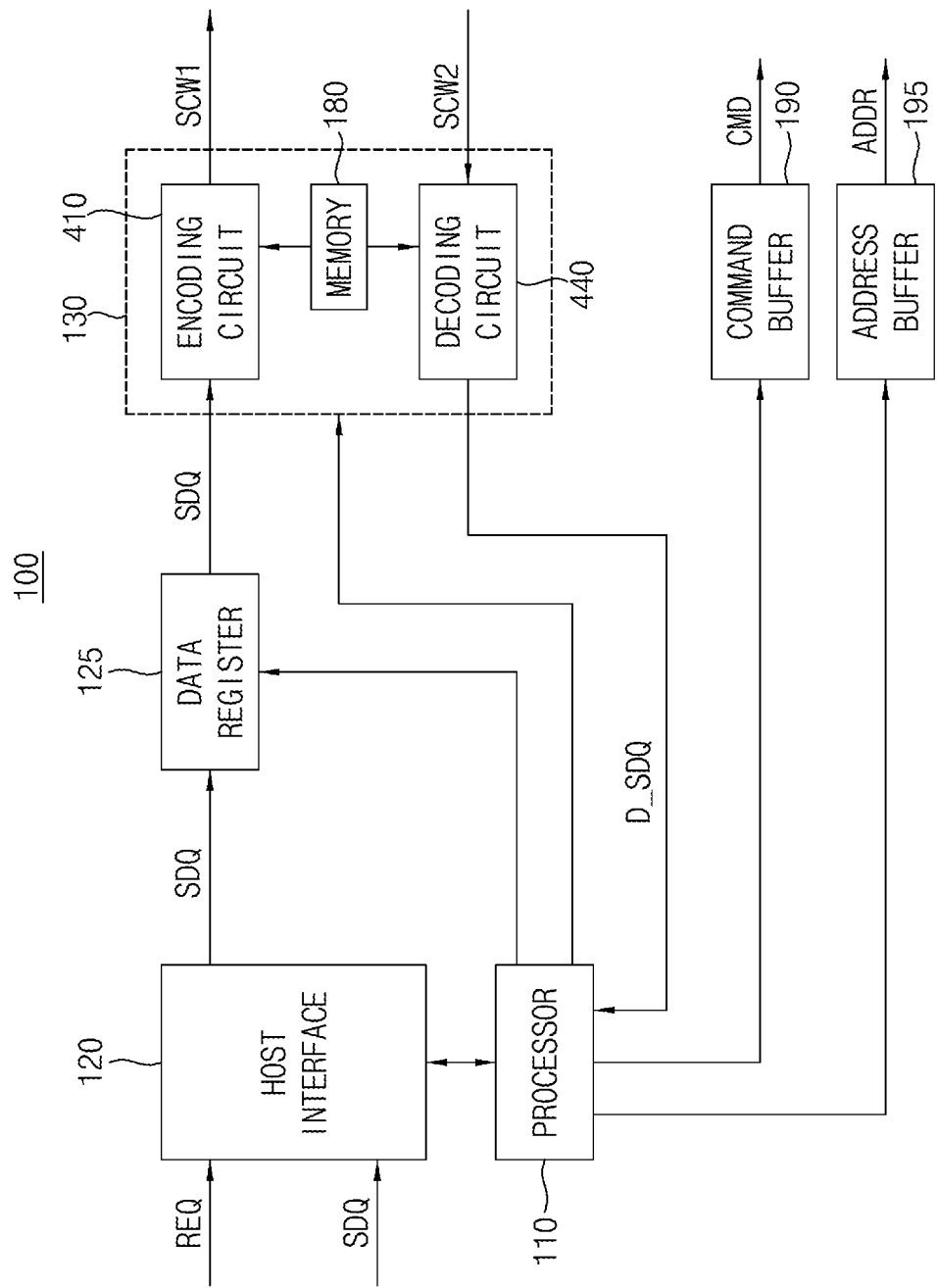
FIG. 2 is block diagram illustrating the memory controller in the memory system of FIG. 1 according to some example embodiments.

FIG. 2 is block diagram illustrating an example of the memory controller in the memory system of FIG. 1 according to some example embodiments.

Referring to FIG. 2, the memory controller 100 may include the processor 110, a host interface 120, a data register 125, the error correction circuit 130, a command buffer 190 and an address buffer 195. The error correction circuit 130 may include an encoding circuit 410, a decoding circuit 440 and a memory 180.

The host interface 120 may receive a request REQ and a user data set SDQ from the host, and may provide the user data set SDQ to the data register 125. The data register 125 may provide the user data set SDQ to the error correction circuit 130.

The encoding circuit 410 may divide the user data set SDQ into a plurality of data units, each of which includes a plurality of data bits, and the encoding circuit 410 may identify each of the plurality of data units as one of a plurality of types based on characteristic of the data bits of the each of the plurality of data units. The encoding circuit 410 may generate data flags indicating the plurality of types, may generate data parities by performing a first ECC encoding on the plurality of data units, may generate flag parities by performing a second ECC encoding on the data flags, may generate an encoded user data set by using at least one null data unit in which all or half of included data bits are zero, from among the plurality of data units as a data duplication space for duplicating a valid data unit in which all or half of included data bits are valid, from among the plurality of data units, may generate a first codeword set SCW1 by interleaving the encoded user data set, the data parities, the data flags, the flag parities and a null bit bit-wisely and may transmit the first codeword set SCW1 to the memory module MM.

The decoding circuit 440 may receive a second codeword set SCW2 from the memory module MM, may generate the encoded user data set, the data parities, the data flags and the flag parities by deinterleaving the second codeword set SCW2 bit-wisely, may generate decoded data flags by performing a first ECC decoding on the data flags based on the flag parities, may generate a decoded user data set D_SDQ by decoding (e.g., performing a second ECC decoding) of the encoded user data set based on the data parities and the decoded data flags, and may provide the decoded user data set D_SDQ to the processor 110.

The memory 180 may store a parity generation matrix and a parity check matrix.

The encoding circuit 410 may perform the first ECC encoding and the second ECC encoding based on the parity generation matrix and the decoding circuit 440 may perform the first ECC decoding and the second ECC decoding based on the parity check matrix.

The processor 110 may receive the decoded user data set D_SDQ and may control the error correction circuit 130, the command buffer 190 and the address buffer 195. The command buffer 190 may store the command CMD corresponding to the request REQ and may transmit the command CMD to the memory module MM under control of the processor 110. The address buffer 195 may store the address ADDR and may transmit the address ADDR to the memory module MM under control of the CPU 110.

Figure 3:
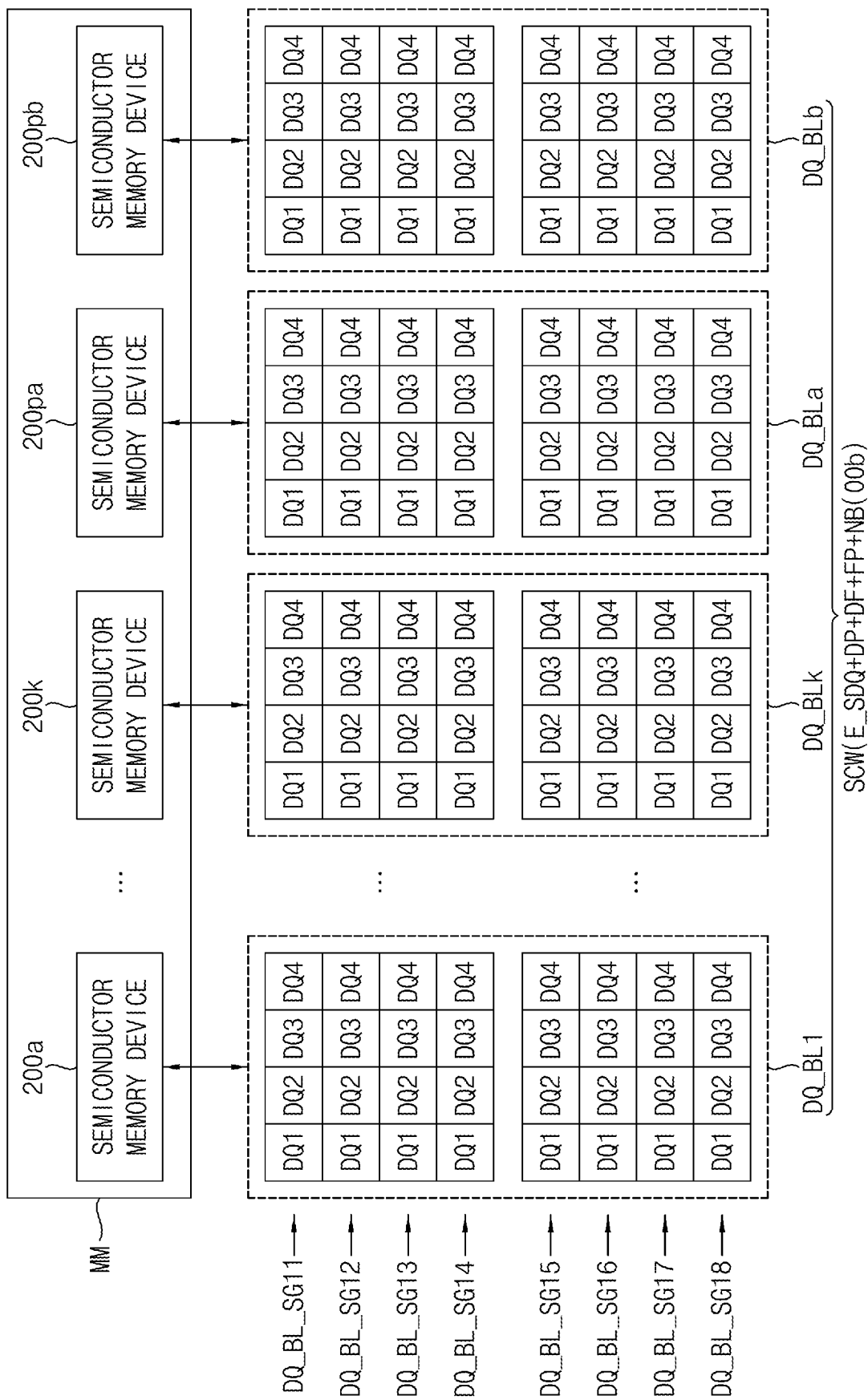
FIG. 3 illustrates data sets corresponding to the plurality of burst lengths in the memory system of FIG. 1, according to some example embodiments.

FIG. 3 illustrates data sets corresponding to a plurality of burst lengths in the memory system of FIG. 1, according to some example embodiments.

Referring to FIG. 3, each of the memory chips 200a~200k, 200pa and 200pb may perform a burst operation. Herein, the burst operation refers to an operation of writing or reading a large amount of data by sequentially increasing or decreasing an initial address provided from the memory controller 100. A basic unit of the burst operation may be referred to a burst length BL.

Each of a plurality of data units DQ_BL1~DQ_BLkm, DQ_BLa, and DQ_BLb corresponding to the plurality of burst lengths are input to/output from each of the each of the memory chips 200a~200k, 200pa and 200pb.

Each of the plurality of data units DQ_BL1~DQ_BLkm, DQ_BLa, and DQ_BLb may include data segments DQ_BL_SG11~DQ_BL_SG18 corresponding to each burst length of the plurality of burst lengths.

The plurality of data units DQ_BL1~DQ_BLkm, DQ_BLa, and DQ_BLb, may correspond to the codeword set SCW, and the codeword set SCW may include an encoded user data set E_SDQ, data parities DP, data flags DF, flag parities FP, and null bits NB. The null bits NB may correspond to '00'.

The burst length is assumed to be 8 in FIG. 3, and it is assumed that the burst operation is performed once. While the burst operation is performed once in each of the memory chips 200a~200k, 200pa and 200pb, data DQ1~DQ4 are input to/output from each of the memory chips 200a~200k, 200pa and 200pb FIG. 4 is a block diagram illustrating one of the memory chips in the memory module of FIG. 1 according to some example embodiments.

Figure 4:
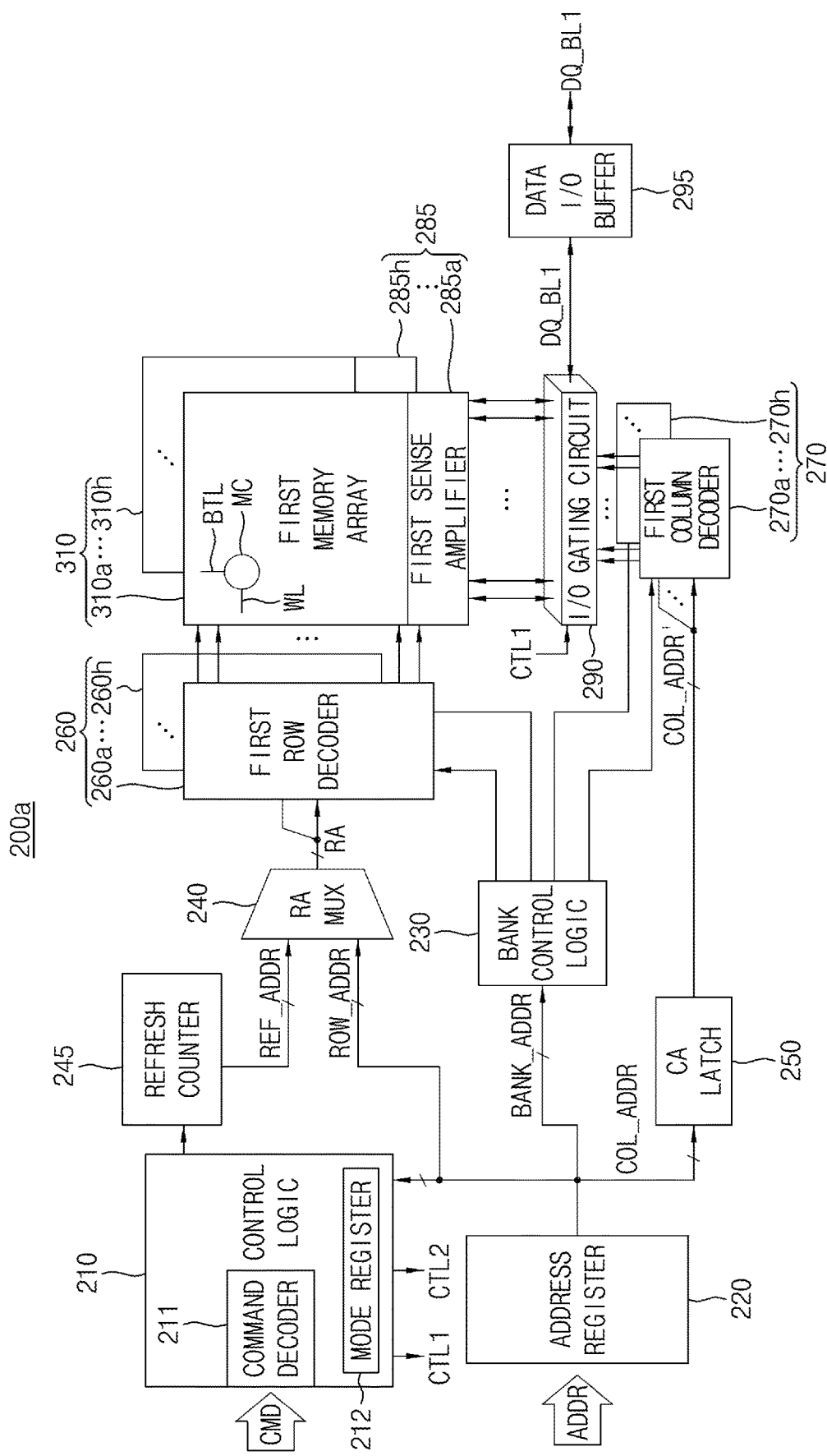
FIG. 4 is a block diagram illustrating one of the memory chips in the memory module of FIG. 1 according to some example embodiments.

In FIG. 4, it is assumed that each of the memory chips 200a~200k, 200pa and 200pb in FIG. 1 employs a volatile memory device.

Referring to FIG. 4, the memory chip 200a may include a control logic circuit 210, an address register 220, a bank control logic circuit 230, a row address multiplexer 240, a column address latch 250, a row decoder 260, a column decoder 270, a memory cell array 310, a sense amplifier unit 285, an input/output (I/O) gating circuit 290, a refresh counter 245 and a data input/output (I/O) buffer 295.

The memory cell array 310 may include first through eighth bank arrays 310a~310h.

The row decoder 260 may include first through eighth bank row decoders 260a~260h coupled to the first through eighth bank arrays 310a~310h, respectively. The column decoder 270 may include first through eighth bank column decoders 270a~270h coupled to the first through eighth bank arrays 3107a~310h, respectively. The sense amplifier unit 285 may include first through eighth bank sense amplifiers 285a~285h coupled to the first through eighth bank arrays 310a~310h, respectively.

The first through eighth bank arrays 310a~310h, the first through eighth bank row decoders 260a~260h, the first through eighth bank column decoders 270a~270h, and the first through eighth bank sense amplifiers 285a~285h may form first through eighth banks. Each of the first through eighth bank arrays may include a plurality of word-lines WL, a plurality of bit-lines BTL, and a plurality of memory cells MC formed at intersections of the word-lines WL and the bit-lines BTL.

Although the memory chip 200a is illustrated in FIG. 4 as including eight banks, the memory chip 200a may include any number of banks.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line WL corresponding to the row address RA. For example, the activated bank row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In some example embodiments of the inventive concepts, in a burst mode, the column address latch 250 may generate column addresses COL_ADDR' that increments from the received column address COL_ADDR. The column address latch 250 may apply the temporarily stored or generated column address COL_ADDR' to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310a~310h, and write control devices for writing data to the first through eighth bank arrays 310a~310h.

Data set read from one of the first through eighth bank arrays 310a~310h may be sensed by a sense amplifier 285a~285h coupled to the one bank array from which the data set is to be read, and may be stored in the read data latches.

The data set DQ_BL1 stored in the read data latches may be provided to the memory controller 100 through the data set to the data I/O buffer 295. Data set DQ_BL1 to be written in one of the first through eighth bank arrays 310~380 may be provided to the data I/O buffer 295 from the memory controller 100. The data I/O buffer 295 may provide the data set DQ_BL1 to the I/O gating circuit 290 and the I/O gating circuit 290 may store the data set DQ_BL1 in a sub-page of one bank array.

The control logic circuit 210 may control operations of the memory chip 200a. For example, the control logic circuit 210 may generate control signals for the memory chip 200a to perform the write operation or the read operation. The control logic circuit 210 may include a command decoder 211 that decodes the command CMD received from the memory controller 100 and a mode register 212 that sets an operation mode of the memory chip 200a.

For example, the command decoder 211 may generate the control signals corresponding to the command CMD by decoding a write enable signal, a row address strobe signal, a column address strobe signal, a chip select signal, etc.

Figure 5:
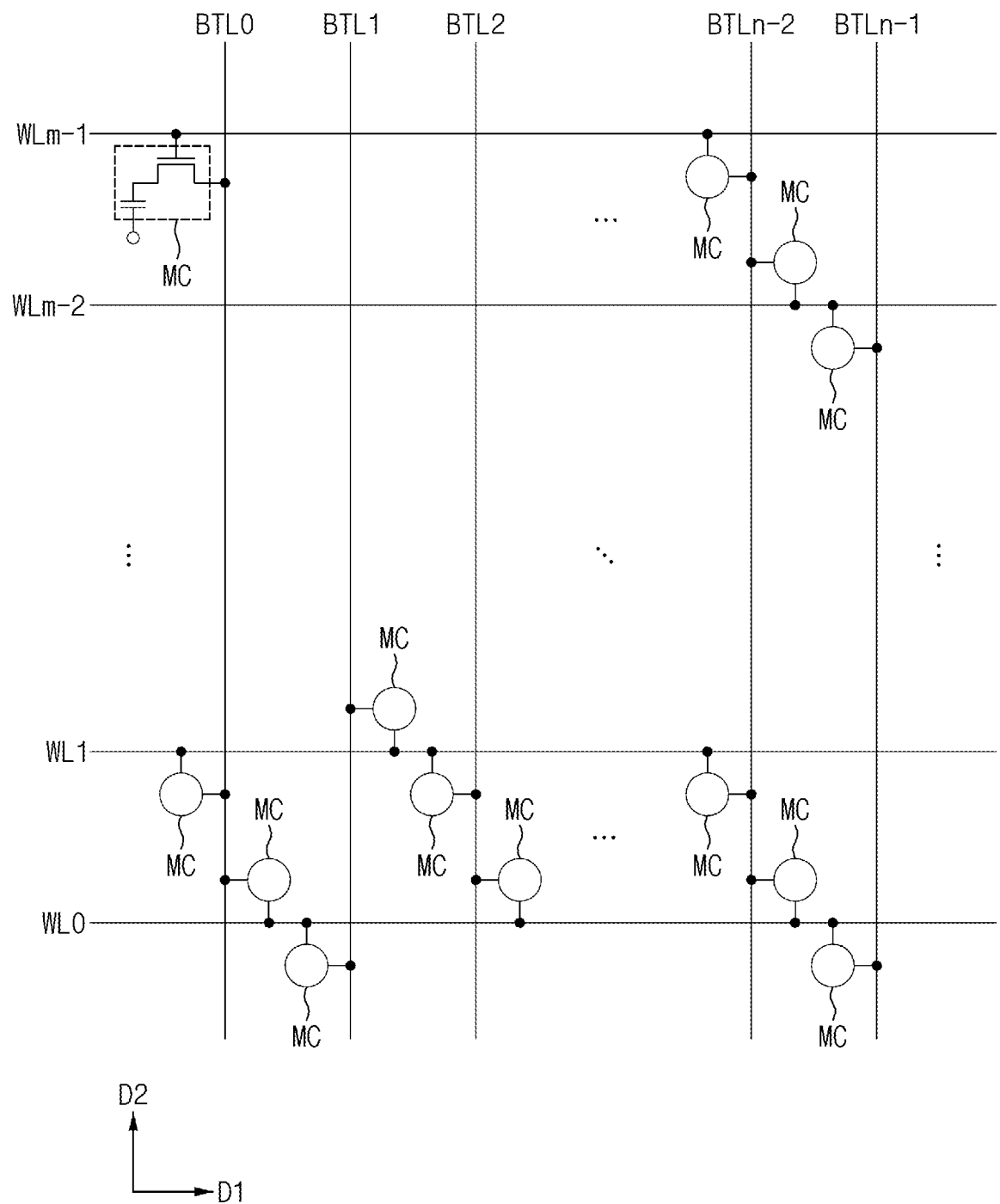
FIG. 5 illustrates an example of the first bank array in the memory chip of FIG. 4 according to some example embodiments.

FIG. 5 illustrates an example of the first bank array in the memory chip of FIG. 4 according to some example embodiments.

Referring to FIG. 5, the first bank array 310a may include a plurality of word-lines WL~WLm−1 (where m is an even number equal to or greater than two), a plurality of bit-lines BTL0~BTLn−1 (where n is an even number equal to or greater than two), and a plurality of memory cells MCs arranged at intersections between the word-lines WL0~WLm−1 and the bit-lines BTL0~BTLn−1.

The word-lines WL~WLm−1 may extend in a first direction D1 and the bit-lines BTL0~BTLn−1 may extend in a second direction D2.

Each of the memory cells MCs may include an access (cell) transistor coupled to one of the word-lines WL0~WLm−1 and one of the bit-lines BTL0~BTLn−1 and a storage (cell) capacitor coupled to the cell transistor. That is, each of the memory cells MCs has a DRAM cell structure.

In addition, the memory cells MCs may have a different arrangement depending on that the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line.

Figure 6:
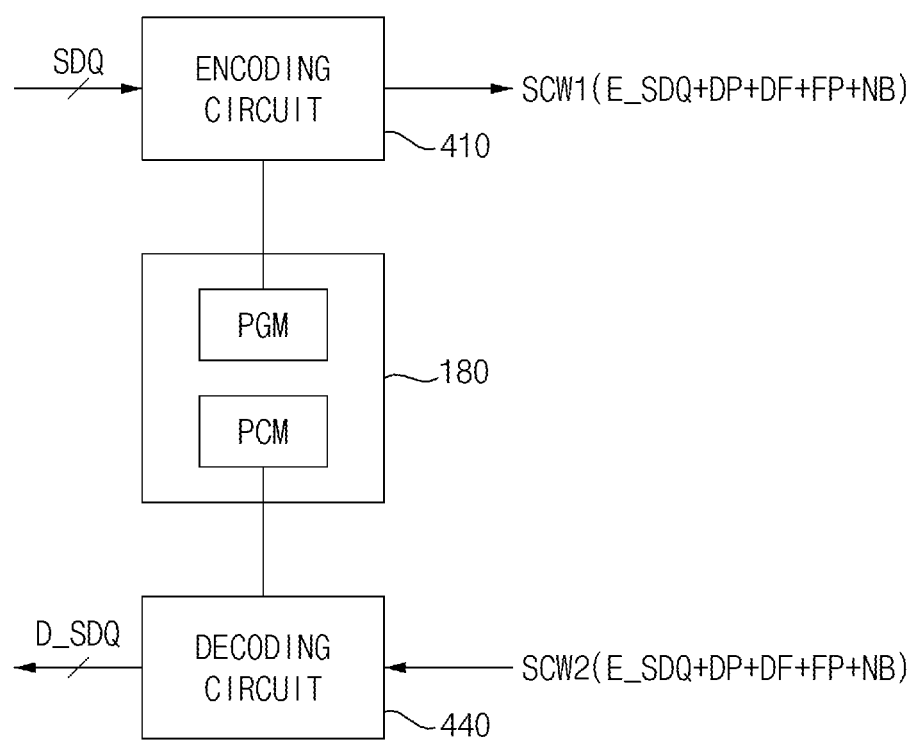
FIG. 6 is a block diagram illustrating an example of the error correction circuit in FIG. 2 according to some example embodiments.

FIG. 6 is a block diagram illustrating an example of the error correction circuit 130 in FIG. 2 according to some example embodiments.

Referring to FIG. 6, the error correction circuit 130 may include an encoding circuit 410, a decoding circuit 440 and a memory 180. The memory 180 may be referred to as an ECC memory 180.

The memory 180 may be connected to the encoding circuit 410 and the decoding circuit 440 and may store a parity generation matrix PGM and a parity check matrix PCM.

The error correction circuit 130, in a write operation, may divide the user data set SDQ into a plurality of data units, each of which includes a plurality of data bits, may identify each of the plurality of data units as one of a plurality of types based on characteristic of the data bits of the each of the plurality of data units, may generate data flags DF indicating the plurality of types, may generate data parities DP by performing a first ECC encoding on the plurality of data units, may generate flag parities FP by performing a second ECC encoding on the data flags DF, may generate the encoded user data set E_SDQ by using at least one null data unit in which all or half of included data bits are zero, from among the plurality of data units as a data duplication space for duplicating a valid data unit in which all or half of included data bits are valid, from among the plurality of data units, and may generate a codeword set SCW1 by interleaving the encoded user data set E_SDQ, the data parities DP, the data flags DF, the flag parities FP and a null bit NB bit-wisely.

The decoding circuit 440, in a read operation, may receive a codeword set SCW2 including the encoded user data set E_SDQ, the data parities DP, the data flags DF, the flag parities FP and the null bit NB which are interleaved, from the memory module MM, may generate the user data set E_SDQ, the data parities DP, the data flags DF and the flag parities FP by deinterleaving the codeword set SCW2 bit-wisely, may generate decoded data flags by performing a first ECC decoding on the data flags DF based on the flag parities FP, may generate the decoded user data set D_SDQ by decoding the encoded user data set ESDQ based on the data parities DP and the decoded data flags.

The encoding circuit 410 may perform the first ECC encoding and the second ECC encoding based on the parity generation matrix PGM and the decoding circuit 440 may perform the first ECC decoding and the second ECC decoding based on the parity check matrix PCM.

Figure 7:
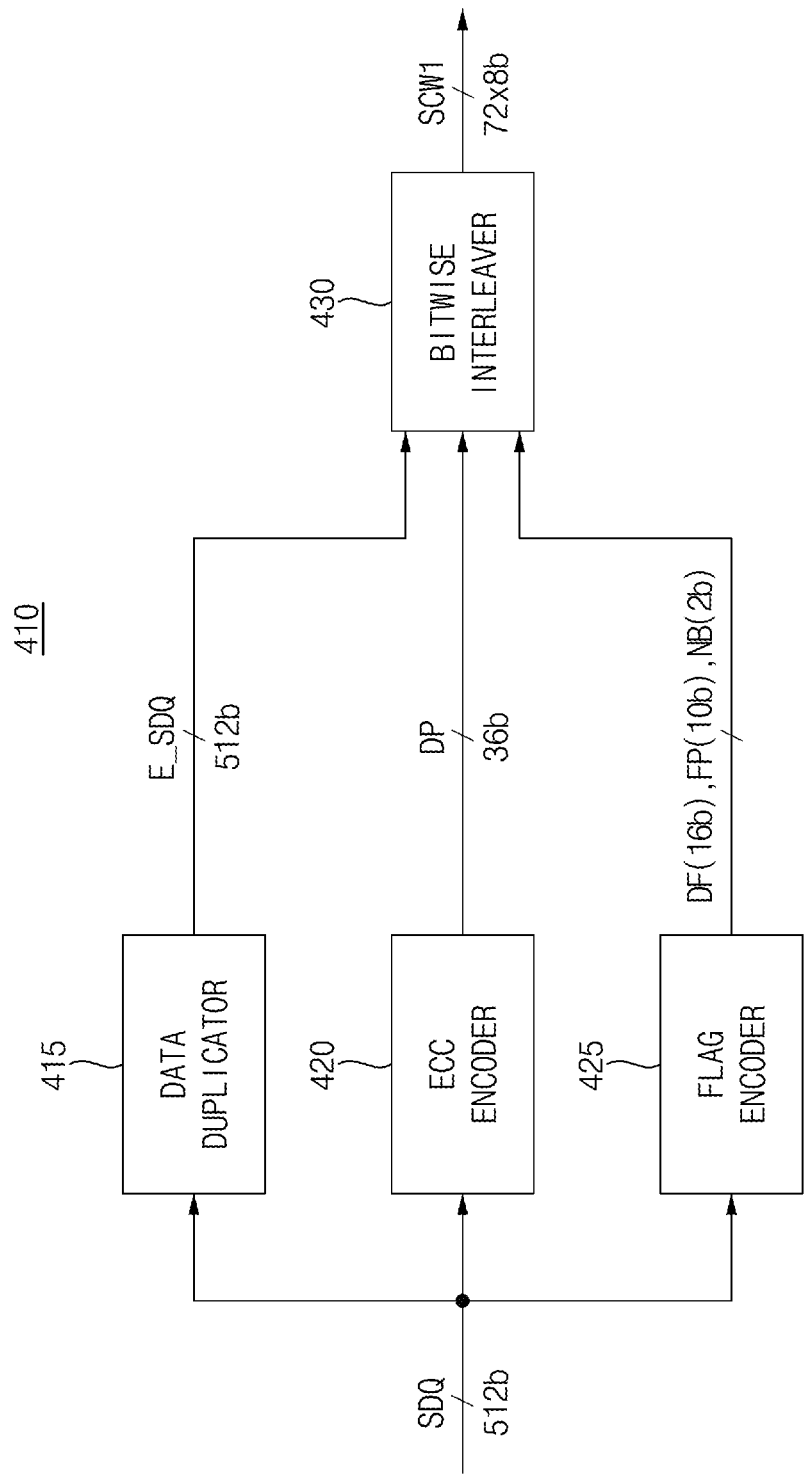
FIG. 7 is a block diagram illustrating an example of the encoding circuit in the error correction circuit of FIG. 6 according to some example embodiments.

FIG. 7 is a block diagram illustrating an example of the encoding circuit 410 in the error correction circuit of FIG. 6 according to example embodiments.

Referring to FIG. 7, the encoding circuit 410 may include a data duplicator 415, an ECC encoder 420, a flag encoder 425 and a bitwise interleaver 430.

The data duplicator 415 may generate the encoded user data set E_SDQ by using at least one null data unit in which all or half of included data bits are zero, from among the plurality of data units of the user data set SDQ as a data duplication space. The data duplication space may be used for duplicating a valid data unit in which all or half of included data bits are valid, from among the plurality of data units, and the data duplicator 415 may provide the encoded user data set E_SDQ to the bitwise interleaver 430.

The ECC encoder 420 may generate the data parities DP by performing a first ECC encoding on the plurality of data units of the user data set SDQ using the parity generation matrix PGM and may provide the data parities DP to the bitwise interleaver 430.

The flag encoder 425 may generate the data flags DF based on the plurality of types of the plurality of data units of the user data set SDQ, may generate the flag parities FP by performing a second ECC encoding on the data flags DF using the parity generation matrix PGM and may provide the bitwise interleaver 430 with the data flags DF, the flag parities FP and the null bit NB including bits of '00'.

The bitwise interleaver 430 may generate the codeword set SCW1 by interleaving the encoded user data set E_SDQ, the data parities DP, the data flags DF, the flag parities FP and the null bit NB bit-wisely.

When the user data set SDQ includes 512 bits, each of the plurality of data units of the user data set SDQ may include 64 bits, and the ECC encoder 420 may generate the data parities DP of 36 bits by performing the first ECC encoding on two data units of 128 bits to generate data parities of 9 bits. The flag encoder 425 may generate the data flags DF of 16 bits by generating data flags of 2 bits with respect to each of the plurality of data units, may generate the flag parities FP of 10 bits in total by generating the flag parities of 5 bits by performing the second ECC encoding on each of the data flags of 8 bits from among the data flags DF of 16 bits and adds the null bit NB of 2 bits. Therefore, the codeword set SCW1 may include 576 bits.

FIG. 8 illustrates an example of the user data set in FIG. 7 according to some example embodiments.

Referring to FIG. 8, the user data set SDQ may be divided (e.g., may be arranged) into a plurality of data units DU0, DU1, DU2, DU3, DU4, DU5, DU6 and DU7.

As mentioned with reference to FIG. 7, when the user data set SDQ includes 512 bits, each of the plurality of data units DU0, DU1, DU2, DU3, DU4, DU5, DU6 and DU7 includes 64 bits.

Each of the data units DU0, DU2, DU4, DU6, in which all of 64 data bits have a logic low level, may correspond to a zero value (ZV), the data unit DU5 may include a first sub data unit SDU51 including upper half 32 bits and a second sub data unit SDU52 including lower half 32 bits, and a value SV1 of the first sub data unit SDU51 may be the same as a value SV2 of the second sub data unit SDU52.

The data unit DU7 may include a third sub data unit SDU71 including upper half 32 bits and a fourth sub data unit SDU72 including lower half 32 bits. All data bits of the third sub data unit SDU71 have a logic low level and the first sub data unit SDU71 may be denoted as sub-zero value (SZV). All data bits of the fourth sub data unit SDU72 have valid values and the fourth sub data unit SDU72 may be denoted as narrow width value (NWV).

Each of the data units DU1 and DU3 include 64 valid bits and each of the data units DU1 and DU3 may be denoted as full width value (FWV).

FIG. 9 is a table illustrating data flags based on characteristics of a plurality of data units.

Referring to FIG. 9, in a table TB1, the data units DU0, DU1, DU5 and DU7, a type and a data flag DF is shown.

The data unit DU0 corresponding to the ZV may be identified to have a first type TY0, and the flag encoder 425 may assign a data flag DF of '01' to the data unit DU0 corresponding to the ZV. The data unit DU7 corresponding to the NWV may be identified to have a second type TY1, and the flag encoder 425 may assign a data flag DF of '10' to the data unit DU7 corresponding to the zero value NWV. The data unit DU5 corresponding to a same value SV may be identified to have a third type TY2, and the flag encoder 425 may assign a data flag DF of '11' to the data unit DU5 corresponding to the SV. The data unit DU1 corresponding to the FWV may be identified to have a fourth type TY3, and the flag encoder 425 may assign a data flag DF of '00' to the data unit DU1 corresponding to the FWV.

The plurality of data units DU0, DU1, DU2, DU3, DU4, DU5, DU6 and DU7 may have a share in the order of the fourth type TY3, the first type TY0, the second type TY1 and the third type TY2. The memory chip 200a includes DRAM cells and the DRAM cells may be divided into a true cell region and an anti cell region. In the true cell region, 0-errors in which a value of '1' is incorrectly read as a value of '0' is more dominant than 1-errors in which a value of '0' is incorrectly read as a value of '1'. Therefore, the flag encoder 425 may reduce error occurrences by assigning the data flag DF of '00' to the data unit having the fourth type TY3.

FIG. 10 is a flow chart illustrating an example operation of the encoding circuit of FIG. 7 according to some example embodiments.

Referring to FIGS. 7 and 10, the data duplicator 415, in response to each of a first number of the data unit having the first type TY0 and a second number of the data unit having the fourth type TY3 being greater than zero, may generate the encoded user data set E_SDQ by duplicating at least a portion of the data units having the fourth type TY3 in at least a portion of the data units having the first type TY0.

The encoding circuit 410 may divide a plurality of data bits of the user data set SDQ into a plurality of data units DU0-DU7 (operation S110).

The flag encoder 425 may identify each of the plurality of data units DU0-DU7 as one of first through fourth types TY0, TY1, TY2 and TY3 based on characteristic of the data bits of the each of the plurality of data units DU0-DU7 (operation S120l).

The data duplicator 415 may determine whether a first number of the data unit having the first type TY0 or a second number of the data unit having the fourth type TY3 is zero (operation S130).

When the first number of the data unit having the first type TY0 or the second number of the data unit having the fourth type TY3 is zero (YES in S130), the data duplicator 415 may end duplication with duplicating nothing (e.g., without duplicating anything) (operation S140).

When each of the first number of the data unit having the first type TY0 and the second number of the data unit having the fourth type TY3 is not zero (YES in S130), the data duplicator 415 may determine whether the first number is equal to or greater than the second number (operation S150).

When the first number is equal to or greater than the second number (YES in S150), the data duplicator 415 may duplicate the data units having the fourth type TY3 in the data units having the first type TY0 as many as possible (operation S160). That is, data duplicator 415 may duplicate the data units having the fourth type TY3 in a portion or all of the data units having the first type TY0.

When the first number is smaller than the second number (NO in S150), the data duplicator 415 may duplicate the data unit having the fourth type TY3 in the data units having the first type TY0 (operation S170). That is, the data duplicator 415 may duplicate at least one data unit corresponding to the first number, from among the data units having the fourth type, in the data unit having the first type.

Figure 11:
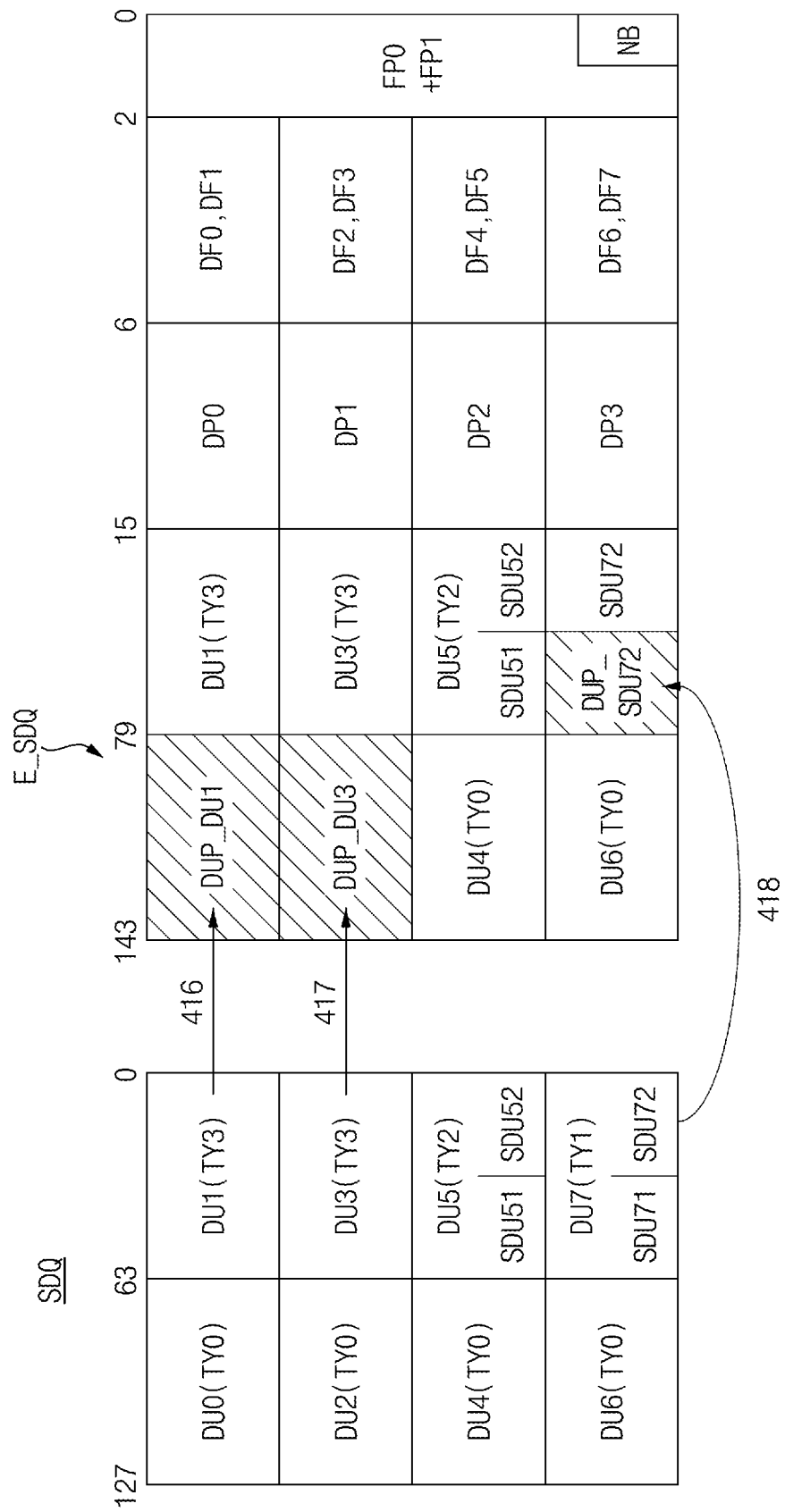
FIG. 11 illustrates an example operation of the encoding circuit of FIG. 7 according to some example embodiments.

FIG. 11 illustrates an example operation of the encoding circuit of FIG. 7 according to some example embodiments.

In FIG. 11, assuming that the user data set SDQ includes four data units DU0, DU2, DU4 and DU6 having the first type TY0, two data units DU1 and DU3 having the fourth type TY3, a data unit DU5 having the third type TY2 and a data unit DU7 having the second type TY1. The data unit DU5 having the third type TY2 may include a first sub data unit SDU51 and a second sub data unit SDU52 and the data unit DU7 having the second type TY1 includes a third sub data unit SDU71 and a fourth sub data unit SDU72.

The data duplicator 415 may generate a first duplicated data unit DUP_DU1 by duplicating the data unit DU1 having the fourth type TY3 in the data unit DU0 having the first type TY0 as indicated by a reference numeral 416, and may generate a second duplicated data unit DUP_DU3 by duplicating the data unit DU3 having the fourth type TY3 in the data unit DU2 having the first type TY0 as indicated by a reference numeral 417.

The data duplicator 415, in response to a third number of the data unit DU7 having the second type TY1 being greater than zero, may generate a duplicated sub data unit DUP_SDU72 by duplicating the fourth sub data unit SDU72 of the data unit DU7 having the second type TY1 in the third sub data unit SDU71 of the data unit DU7 as indicated by a reference numeral 418. Through above-mentioned process, the data duplicator 415 may generate the encoded user data set D_SDQ by duplicating a portion of the user data set SDQ.

The ECC encoder 420, by using the parity generation matrix PGM, may generate a 9-bit data parity DP0 by performing a first ECC encoding on the data units DU0 and DU1, may generate a 9-bit data parity DP1 by performing a first ECC encoding on the data units DU2 and DU3, may generate a 9-bit data parity DP2 by performing a first ECC encoding on the data units DU4 and DU5 and may generate a 9-bit data parity DP3 by performing a first ECC encoding on the data units DU6 and DU7.

The flag encoder 425 may assign each of 2-bit data flags DF0, DF1, DF2, DF3, DF4, DF5, DF6 and DF7 to respective one of the data units DU0, DU1, DU2, DU3, DU4, DU5, DU6 and DU7, may generate 5-bit parity flag FP0 by performing a second ECC encoding on the data flags DF0, DF1, DF2 and DF3, may generate 5-bit parity flag FP1 by performing a second ECC encoding on the data flags DF4, DF5, DF6 and DF7 and may add the null bit NB of 2-bit.

The bitwise interleaver 430 may generate the codeword set SCW1 by interleaving the encoded user data set E_SDQ, the data parities DP0, DP1, DP2 and DP3, the data flags DF0, DF1, DF2, DF3, DF4, DF5, DF6 and DF7, the flag parities FP0 and FP1 and the null bit NB bit-wisely.

Figure 12:
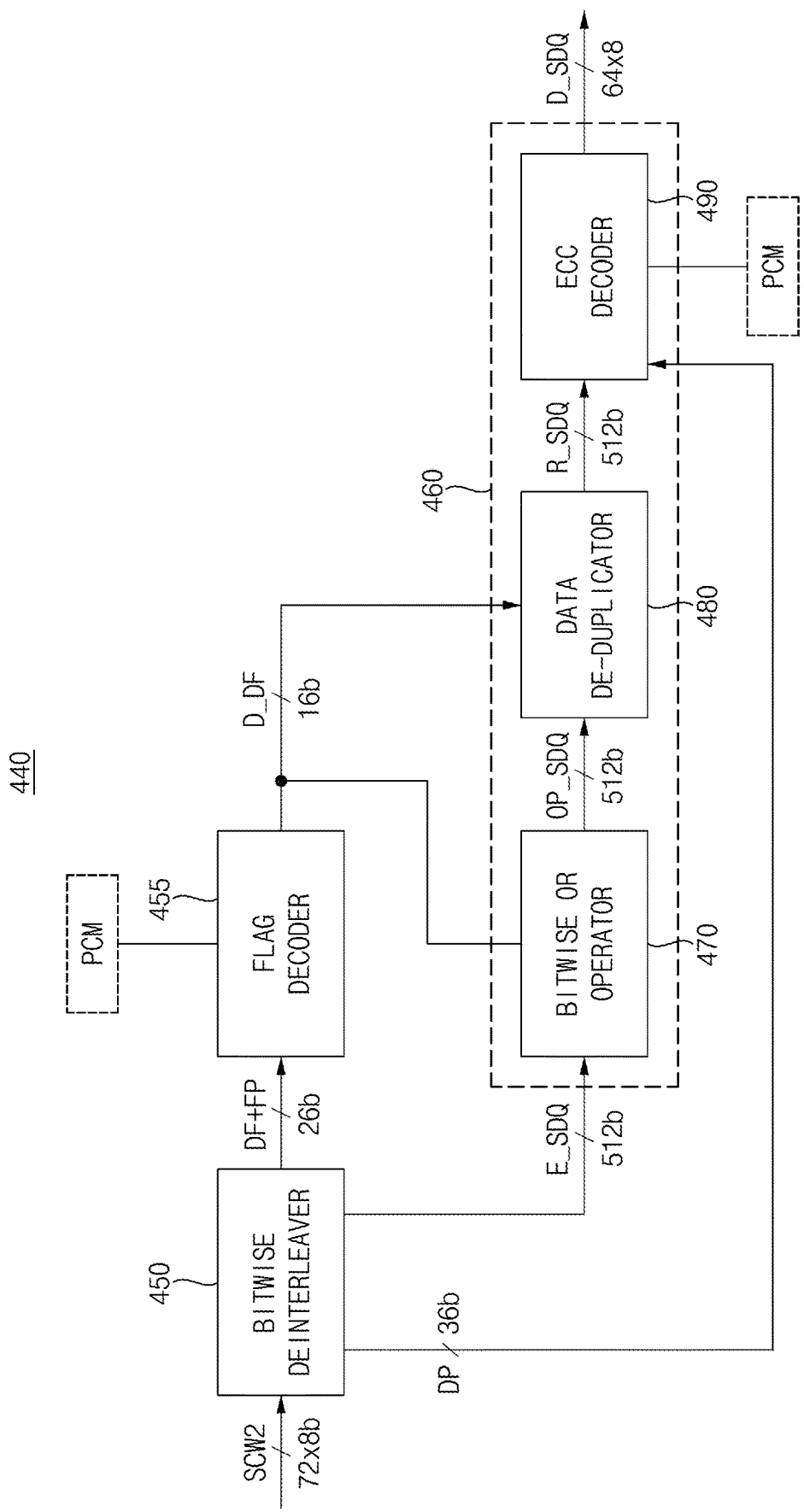
FIG. 12 is a block diagram illustrating an example of the encoding circuit in the error correction circuit of FIG. 6 according to some example embodiments.

FIG. 12 is a block diagram illustrating an example of the encoding circuit in the error correction circuit of FIG. 6 according to some example embodiments.

Referring to FIG. 12, the decoding circuit 440 may include a bitwise deinterleaver 450, a flag encoder 455 and a data correction circuit 460.

The bitwise deinterleaver 450 may generate the encoded user data set E_SDQ, the data parities DP, the data flags DF and the flag parities FP by deinterleaving the codeword set SCW2 bit-wisely, may provide the data flags DF and the flag parities FP to the flag decoder 455, and may provide the encoded user data set E_SDQ and the data parities DP to the data correction circuit 460.

The flag decoder 455 may generate decoded data flags D_DF by performing a first ECC decoding on the data flags DF based on the flag parities FP by using the parity check matrix PCM and may provide the decoded data flags D_DF to the data correction circuit 460.

The data correction circuit 460 may generate a decoded user data set D_SDQ by decoding the encoded user data set E_SDQ based on the data parities DP and the decoded data flags D_DF.

The data correction circuit 460 may include a bitwise OR operator 470, a data de-duplicator 480 and an ECC decoder 490.

The bitwise OR operator 470 may generate an operation data set OP_SDQ by performing OR operation on the encoded user data set E_SDQ bit-wisely based on the decoded data flags D_DF. The data de-duplicator 480 may generate a recovered data set R_SDQ by eliminate duplications in the operation data set OP_SDQ based on the decoded data flags D_DF.

The ECC decoder 490 may generate the decoded user data set D_SDQ by performing a second ECC decoding on the recovered user data set R_SDQ based on the data parities DP by using the parity check matrix PCM.

When the codeword set SCW2 includes 576 bits, the data flags DF and the flag parities FP include 26 bits, the data parities DP include 36 bits and the decoded data flags D_DF include 16 bits.

Figure 13:
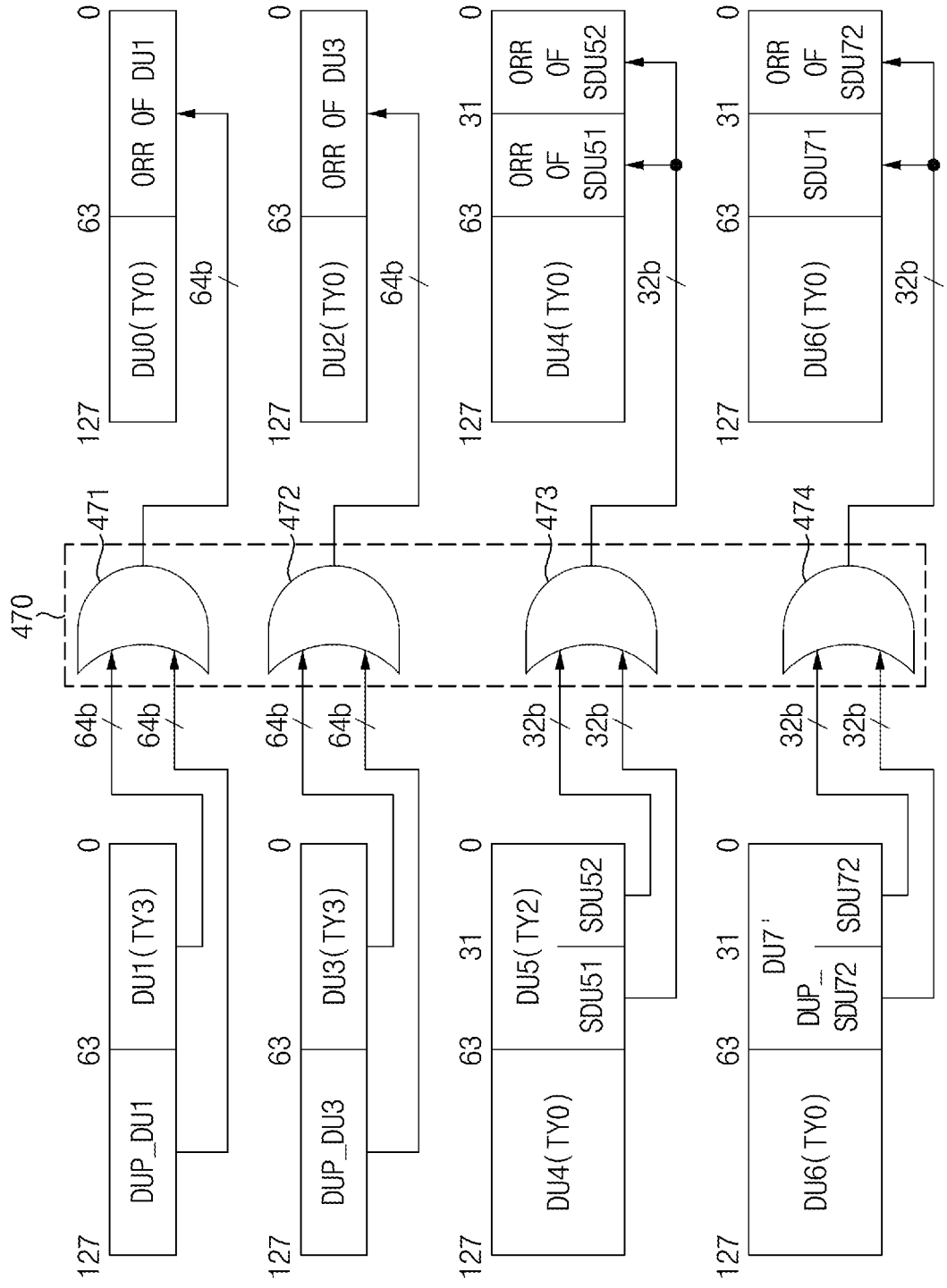
FIG. 13 illustrates example operations of the bitwise OR operator and the data de-duplicator in the decoding circuit of FIG. 12 according to some example embodiments.

FIG. 13 illustrates example operations of the bitwise OR operator and the data de-duplicator in the decoding circuit of FIG. 12 according to some example embodiments.

The bitwise OR operator 470 may include a plurality of OR gates 471, 472, 473 and 474.

The OR gate 471 may generate a first operated data unit ORR OF DU1 by performing OR operation on each of data bits of the data unit DU1 having the fourth type TY3 and respective one of data bits of the first duplicated data unit DUP_DU1, and the data de-duplicator 480 may recover the data unit DU0 having the first type TY0 by setting each of the data bits of the first duplicated data unit to a logic low level.

The OR gate 472 may generate a second operated data unit ORR OF DU3 by performing OR operation on each of data bits of the data unit DU3 having the fourth type TY3 and respective one of data bits of the second duplicated data unit DUP_DU3, and the data de-duplicator 480 may recover the data unit DU2 having the first type TY0 by setting each of the data bits of the first duplicated data unit to a logic low level.

The OR gate 473 may generate a first sub operated data unit ORR OF SDU51 and a second sub operated data unit ORR OF SDU52 by performing OR operation on each of the upper half bits in the first sub data unit SDU51 of the data unit DU5 having the third type TY2 and respective one of the lower half bits in the second sub data unit SDU51 of the data unit DU5 having the third type TY2.

The OR gate 474 may generate an operated sub data unit ORR OF SDU72 by performing OR operation on each of lower half bits of the fourth sub data unit SDU72 of the data unit having the second type TY1 and respective one of data bits of a duplicated sub data unit DUP_SDU72 obtained by duplicating the fourth sub data unit SDU72, and the data de-duplicator 480 may recover the third sub data unit SDU71 by setting each of data bits of the duplicated sub data unit DUP_SDU72 to a logic low level.

Each of the OR gates 471, 472, 473 and 474 may correct 0-error in which in which a value of '1' is incorrectly read as a value of '0' through bitwise OR operation. The ECC decoder 490 may correct 0-error which occurs in bits of same locations of an original data bit and a duplicated data bit through the second ECC decoding.

Figure 14:
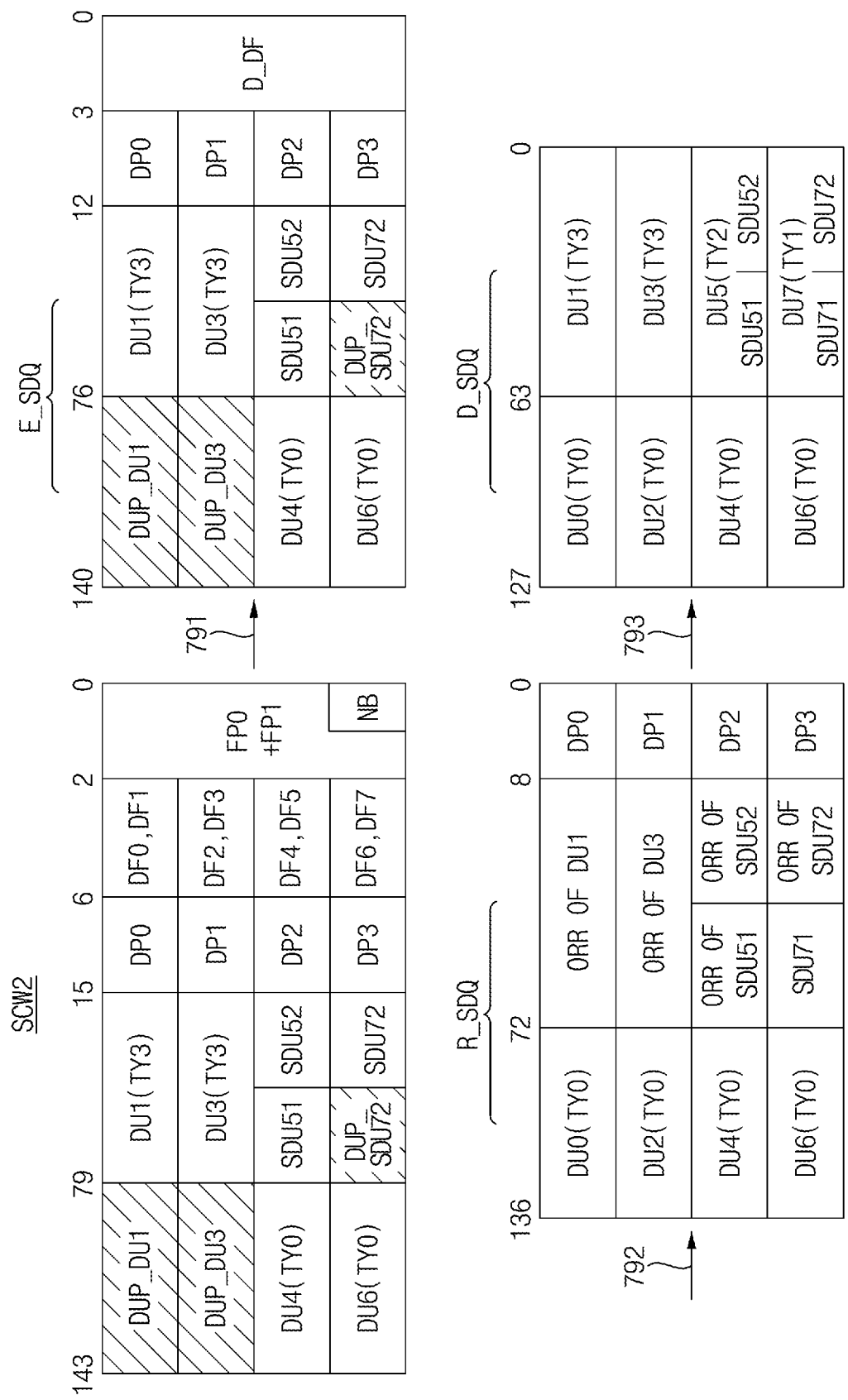
FIG. 14 illustrates an example operation of the decoding circuit of FIG. 12 according to some example embodiments.

FIG. 14 illustrates an example operation of the decoding circuit of FIG. 12 according to some example embodiments.

Referring to FIG. 14, the codeword set SCW2 received from the memory module MM may include the encoded user data set E_SDQ, the data parities DP, the data flags DF, the flag parities FP and the null bit NB which are bit-wisely interleaved.

When the flag decoder 455 performs the first ECC decoding, the decoded data flags D_DF may be generated as indicated by a reference numeral 791, when the bitwise OR operator 470 and the data de-duplicator 480, the recovered user data set R_SDQ may be generated as indicated by a reference numeral 792, and when the ECC decoder 490 performs the second ECC decoding on the recovered user data set R_SDQ, the decoded user data set D_SDQ may be generated as indicated by a reference numeral 793.

Accordingly, the error correction circuit 130 in the memory controller 100 may generate the encoded user data set by using at least one null data unit in which all or half of included data bits are zero, from among the plurality of data units as a data duplication space for duplicating a valid data unit in which all or half of included data bits are valid, from among the plurality of data units. The error correction circuit 130 may generate a codeword set by interleaving the encoded user data set, the data parities, the data flags, the flag parities and a null bit bit-wisely and may store the codeword set in the plurality of memory chips, and thus may correct errors occurring in one memory chip. In addition, the error correction circuit 130 may correct 0-error in which in which a value of '1' is incorrectly read as a value of '0' through bitwise OR operation and may correct 0-error which occurs in bits of same locations of an original data bit and a duplicated data bit through the second ECC decoding. Therefore, the error correction circuit 130 may correct 64-bit errors or 32-bit errors with respect to the duplicated data units without additional storage overhead and thus may enhance reliability of memory chips greatly.

Figure 15:
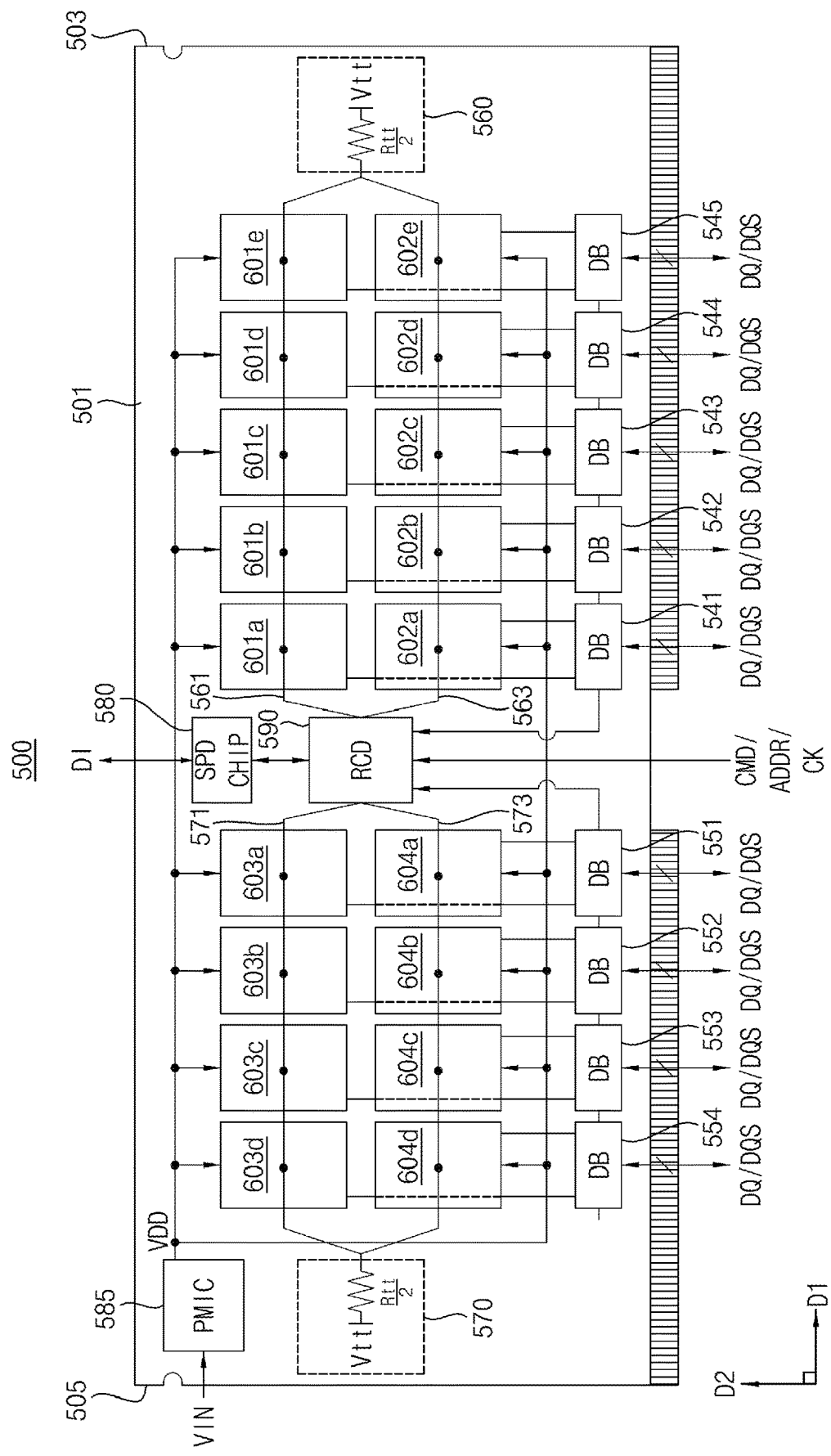
FIG. 15 is a block diagram illustrating a memory module that may be employed by the memory system according to some example embodiments.

FIG. 15 is a block diagram illustrating a memory module that may be employed by the memory system according to some example embodiments.

Referring to FIG. 15, a memory module 500 may include a registered clock driver (RCD) 590 arranged in or mounted on a circuit board 501, a plurality of semiconductor memory devices 601a~601e, 602a~602e, 603a~603d, and 604a~604d, a plurality of data buffers 541~545 and 551~554, module resistance units 560 and 570, a serial present detect (SPD) chip 580, and a power management integrated circuit (PMIC) 585.

The RCD 590 may control the semiconductor memory devices 601a~601e, 602a~602e, 603a~603d, and 604a~604d and the PMIC 585 under control of the memory controller 100. For example, the RCD 590 may receive an address ADDR, a command CMD, and a clock signal CK from the memory controller 100.

The SPD chip 580 may be a programmable read only memory (e.g., EEPROM). The SPD chip 580 may include initial information or device information DI of the memory module 100. In some example embodiments, the SPD chip 580 may include the initial information or the device information DI such as a module form, a module configuration, a storage capacity, a module type, an execution environment, or the like of the memory module 500.

When a memory system including the memory module 500 is booted up, the memory controller 100 may read the device information DI from the SPD chip 580 and may recognize the memory module 500 based on the device information DI. The memory controller 100 may control the memory module 500 based on the device information DI from the SPD chip 580. For example, the memory controller 100 may recognize a type of the semiconductor memory devices included in the memory module 500 based on the device information DI from the SPD chip 580.

Here, the circuit board 501 may be a printed circuit board, which may extend in a first direction D1, perpendicular to a second direction D2, between a first edge portion 503 and a second edge portion 505. The first edge portion 503 and the second edge portion 505 may extend in the second direction D2.

The RCD 590 may be provided at a center of the circuit board 501. The plurality of semiconductor memory devices 601a~601e, 602a~602e, 603a~603d, and 604a~604d may be arranged in a plurality of rows between the RCD 590 and the first edge portion 503 and between the control device 590 and the second edge portion 505.

In this case, the semiconductor memory devices 601a~601e and 602a~602e may be arranged along a plurality of rows between the RCD 590 and the first edge portion 503. The semiconductor memory devices 603a~603d, and 604a~604d may be arranged along a plurality of rows between the RCD 590 and the second edge portion 505. The semiconductor memory devices 601a~601d, 602a~602d, 603a~603d, and 604a~604d may be referred to data chips, and the semiconductor memory devices 601e and 602e may be referred to as first and second parity chips respectively.

Each of the plurality of semiconductor memory devices 601a~601e, 602a~602e, 603a~603d, and 604a~604d may be coupled to a corresponding one of the data buffers 541~545 and 551~554 through a data transmission line for receiving/transmitting data signal DQ and data strobe signal DQS.

The RCD 590 may provide a command/address signal (e.g., CA) to the semiconductor memory devices 601a~601e through a command/address transmission line 561 and may provide a command/address signal to the semiconductor memory devices 602a~602e through a command/address transmission line 563.

In addition, the RCD 590 may provide a command/address signal to the semiconductor memory devices 603a~603d through a command/address transmission line 571 and may provide a command/address signal to the semiconductor memory devices 604a~604d through a command/address transmission line 573.

The command/address transmission lines 561 and 563 may be connected in common to a module resistance unit 560 (e.g., a first module resistance unit 560) adjacent to the first edge portion 503, and the command/address transmission lines 571 and 573 may be connected in common to a module resistance unit 570 (e.g., a second module resistance unit 570) adjacent to the second edge portion 505.

Each of the module resistance units 560 and 570 may include a termination resistor Rtt/2 connected to a termination voltage Vtt. In this case, an arrangement of the module resistance units 560 and 570 may reduce the number of the module resistance units, thus reducing an area where termination resistors are provided.

In addition, each of the plurality of semiconductor memory devices 601a~601e, 602a~602e, 603a~603d, and 604a~604d may be a DRAM device.

The SPD chip 580 may be provided adjacent to the RCD 590 and the PMIC 585 may be between the semiconductor memory device 603d and the second edge portion 505. The PMIC 585 may generate a power supply voltage VDD based on an input voltage VIN and may provide the power supply voltage VDD to the semiconductor memory devices 601a~601e, 602a~602e, 603a~603d, and 604a~604d.

Although it is illustrated as the PMIC 585 is adjacent to the second edge portion 505 in FIG. 15, the PMIC 585 may be provided in a central portion of the circuit board 501 to be adjacent to the RCD 590 in some example embodiments, or provided adjacent to the first edge portion 503.

Figure 16:
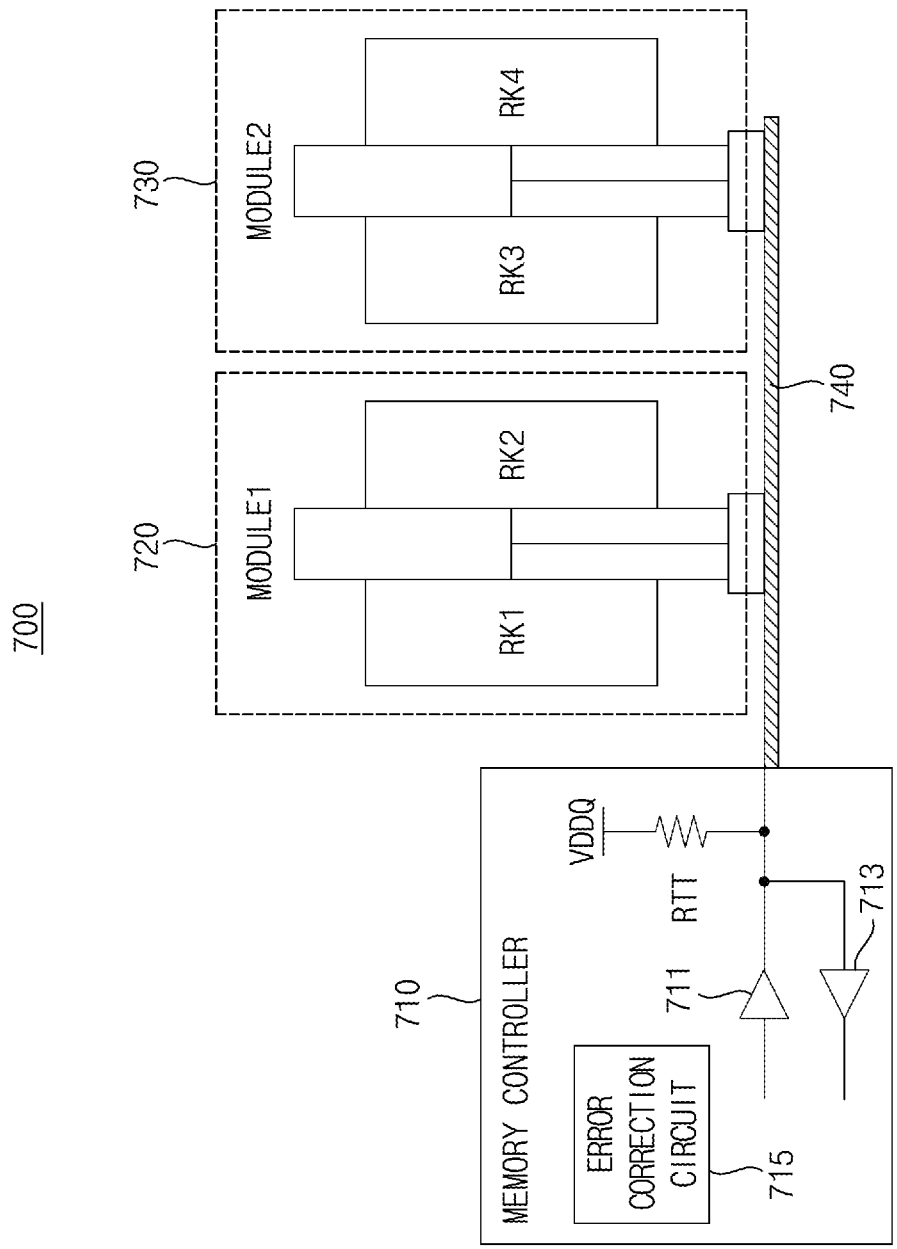
FIG. 16 is a block diagram illustrating a memory system having quad-rank memory modules according to some example embodiments.

FIG. 16 is a block diagram illustrating a memory system having quad-rank memory modules according to some example embodiments.

Referring to FIG. 16, a memory system 700 may include a memory controller 710 and at least one or more memory modules 720 and 730.

The memory controller 710 may control the memory module 720 and/or the memory module 730 so as to perform a command supplied from a processor or host. The memory controller 710 may be implemented in a processor or host, or may be implemented with an application processor or a system-on-a-chip (SoC). The memory controller 710 may include a transmitter 711 configured to transmit a signal to the at least one or more memory modules 720 and 730, and a receiver 713 configured to receive a signal from the at least one or more memory modules 720 and 730. For signal integrity, a source termination may be implemented with a resistor RTT on a bus 740 of the memory controller 710. The resistor RTT may be coupled to a power supply voltage VDDQ. The memory controller 710 may include an error correction circuit 715 and the error correction circuit 715 may employ the error correction circuit 130 of FIG. 6.

Therefore, the error correction circuit 715 may include an encoding circuit and a decoding circuit. The encoding circuit may generate an encoded user data set by using at least one null data unit in which all or half of included data bits are zero, from among the plurality of data units as a data duplication space for duplicating a valid data unit in which all or half of included data bits are valid, from among the plurality of data units, may generate a codeword set by interleaving the encoded user data set, the data parities, the data flags, the flag parities and a null bit bit-wisely and may store the codeword set in at least one of the one or memory modules 720 and 730. The decoding circuit may correct errors by performing or operation on original data unit and duplicated data unit of the codeword set read from at least one of the one or memory modules 720 and 730 and may correct errors again based on single error correction and double error detection (SECDED) code.

The at least one or more memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module MM in FIG. 1. The first memory module 720 may include at least one or more memory ranks RK1 and RK2, and the second memory module 730 may include one or more memory ranks RK3 and RK4.

Each of the first memory module 720 and the second memory module 730 may include a plurality of memory chips.

Figure 17:
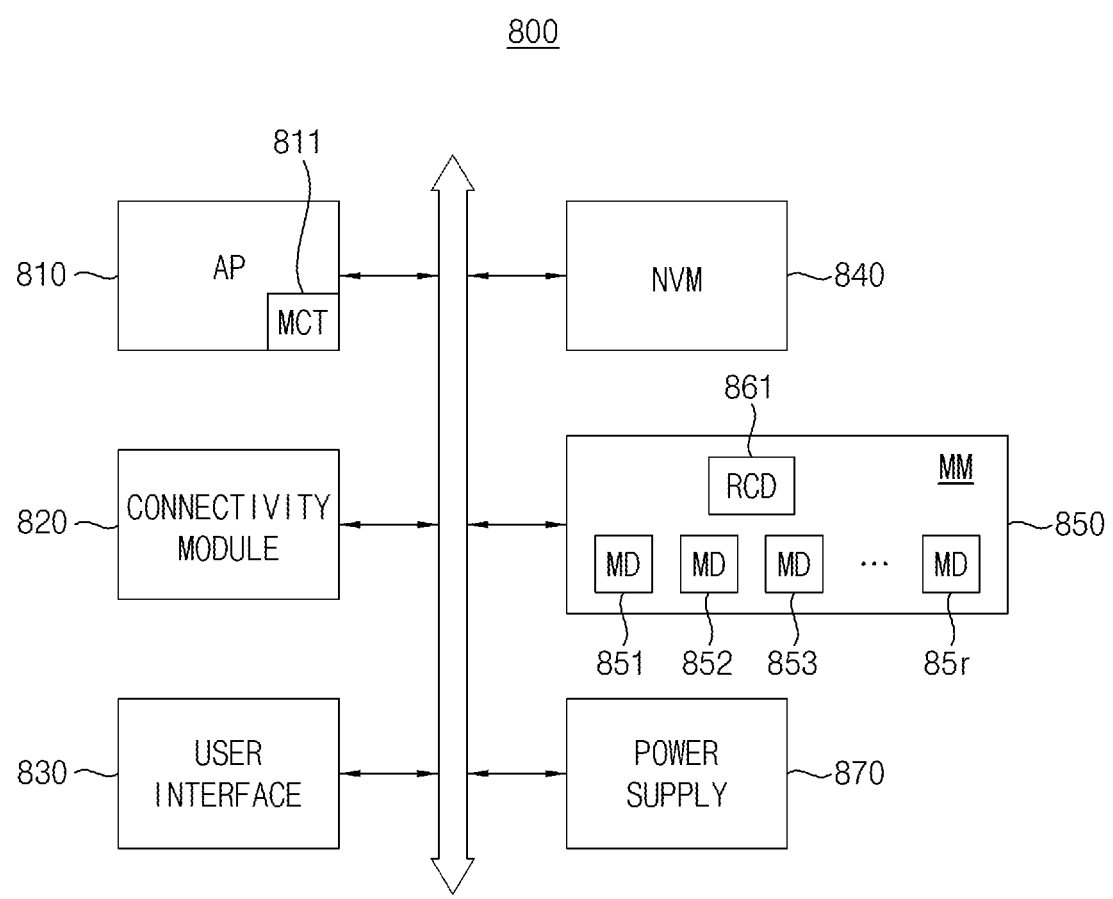
FIG. 17 is a block diagram illustrating a mobile system including a memory module according to some example embodiments.

FIG. 17 is a block diagram illustrating a mobile system including a memory module according to some example embodiments.

Referring to FIG. 17, a mobile system 800 may include an application processor 810, a connectivity module 820, a memory module MM 850, a nonvolatile memory device 840, a user interface 830, and a power supply 870. The application processor 810 may include a memory controller (MCT) 811. The memory controller 811 may include the system ECC engine 130 of FIG. 6.

The application processor 810 may execute applications, such as a web browser, a game application, a video player, or the like. The connectivity module 820 may perform wired or wireless communication with an external device.

The memory module 850 may store data processed by the application processor 810 or operate as a working memory. The memory module 850 may include a plurality of semiconductor memory devices MD 851, 852, 853, and 85r (where r is a positive integer greater than three), and a RCD 861.

The semiconductor memory devices 851, 852, 853, and 85r may include a plurality of memory chips. Therefore, the memory controller 811 may generate an encoded user data set by using at least one null data unit in which all or half of included data bits are zero, from among the plurality of data units as a data duplication space for duplicating a valid data unit in which all or half of included data bits are valid, from among the plurality of data units.

The nonvolatile memory device 840 may store a boot image for booting the mobile system 800. The user interface 830 may include at least one input device, such as a keypad, a touch screen, etc., and at least one output device, such as a speaker, a display device, etc. The power supply 870 may supply an operating voltage to the mobile system 800.

The mobile system 800 or components of the mobile system 800 may be mounted using various types of packages.

Figure 18:
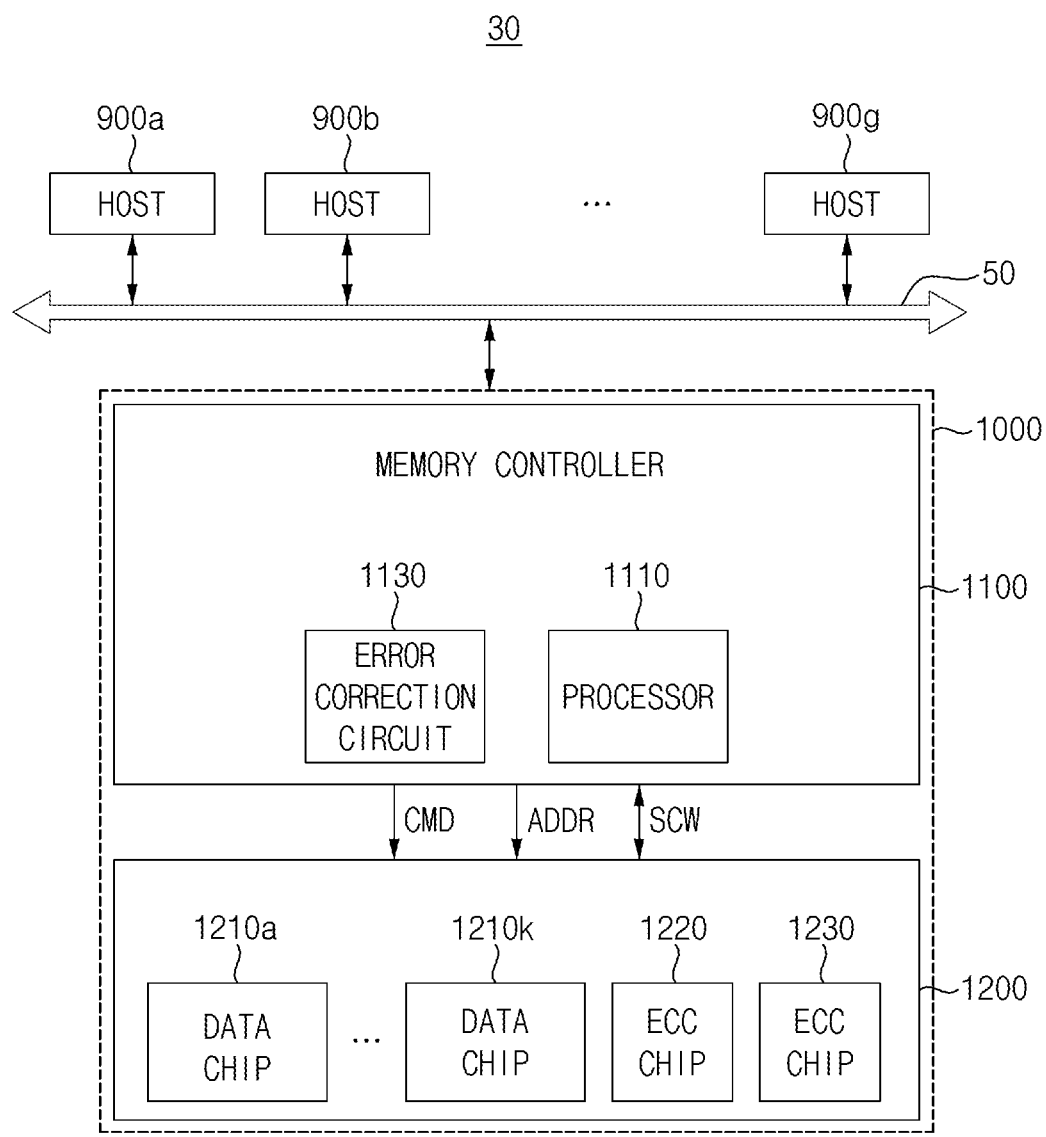
FIG. 18 is a block diagram illustrating a computing system according to some example embodiments.

FIG. 18 is a block diagram illustrating a computing system according to some example embodiments.

Referring to FIG. 18, a computing system 30 may include a plurality of hosts 900a, 900b, . . . , 900g and a memory system 1000, and the memory system 1000 may include a memory controller 1100 and a memory module 1200. Here, g is a natural number greater than two.

The memory module 1200 may include a plurality of data chips 1210a~1210k, a first parity chip 1220 and a second parity chip 1230. The first parity chip 1220 and the second parity chip 1230 may be referred to as an ECC chip.

The memory controller 1100 may apply a command CMD and an address ADDR to the memory module 1200, may exchange a codeword set SCW with the memory module 1200.

The memory controller 1100 may include a processor 1110 and an error correction circuit 1130.

The processor 1110 may control overall operation of the memory controller 1100.

The error correction circuit 1130 may generate an encoded user data set by using at least one null data unit in which all or half of included data bits are zero, from among the plurality of data units as a data duplication space for duplicating a valid data unit in which all or half of included data bits are valid, from among the plurality of data units, may generate the codeword set SCW by interleaving the encoded user data set and may transmit the codeword set SCW to the memory module 1200.

The memory controller 1100 may be connected to the plurality of hosts 900a, 900b, . . . , 900g through a compute express link (CXL) bus 50, may control the plurality of data chips 1210a~1210k, the first parity chip 1220 and the second parity chip 1230, and/or may communicate with the plurality of hosts 900a, 900b, . . . , 900g through the CXL interface.

In some embodiments, the CXL bus 50 may support a plurality of CXL protocols, and messages and/or data may be transmitted through the plurality of CXL protocols. For example, the plurality of CXL protocols may include a non-coherent protocol (or an I/O protocol CXL.io), a coherent protocol (or a cache protocol CXL.cache), and/or a memory access protocol (or a memory protocol CXL.memory). In some embodiments, the CXL bus 50 may support protocols such as peripheral component interconnection (PCI), PCI express (PCIe), universal serial bus (USB), and serial advanced technology attachment (SATA). A protocol supported by the CXL bus 50 may referred to as an interconnect protocol.

The memory controller 1100 may refer to a device that provides functions to the plurality hosts 900a, 900b, . . . , 900g. Based on the CXL specification 2.0, the memory controller 1100 may be an accelerator that supports the CXL specification. For example, at least some of computing operations and I/O operations executed in the plurality hosts 900a, 900b, . . . , 900g may be off-loaded to the memory controller 1100. In some embodiments, the each of the plurality hosts 900a, 900b, . . . , 900g may include any one or any combination of a programmable component (e.g., a graphic processing unit (GPU), a neural processing unit (NPU), a component (e.g., an intellectual property (IP) core) that provides a fixed function, and/or a reconfigurable component (e.g., a field programmable gate array (FPGA)).

Figure 19:
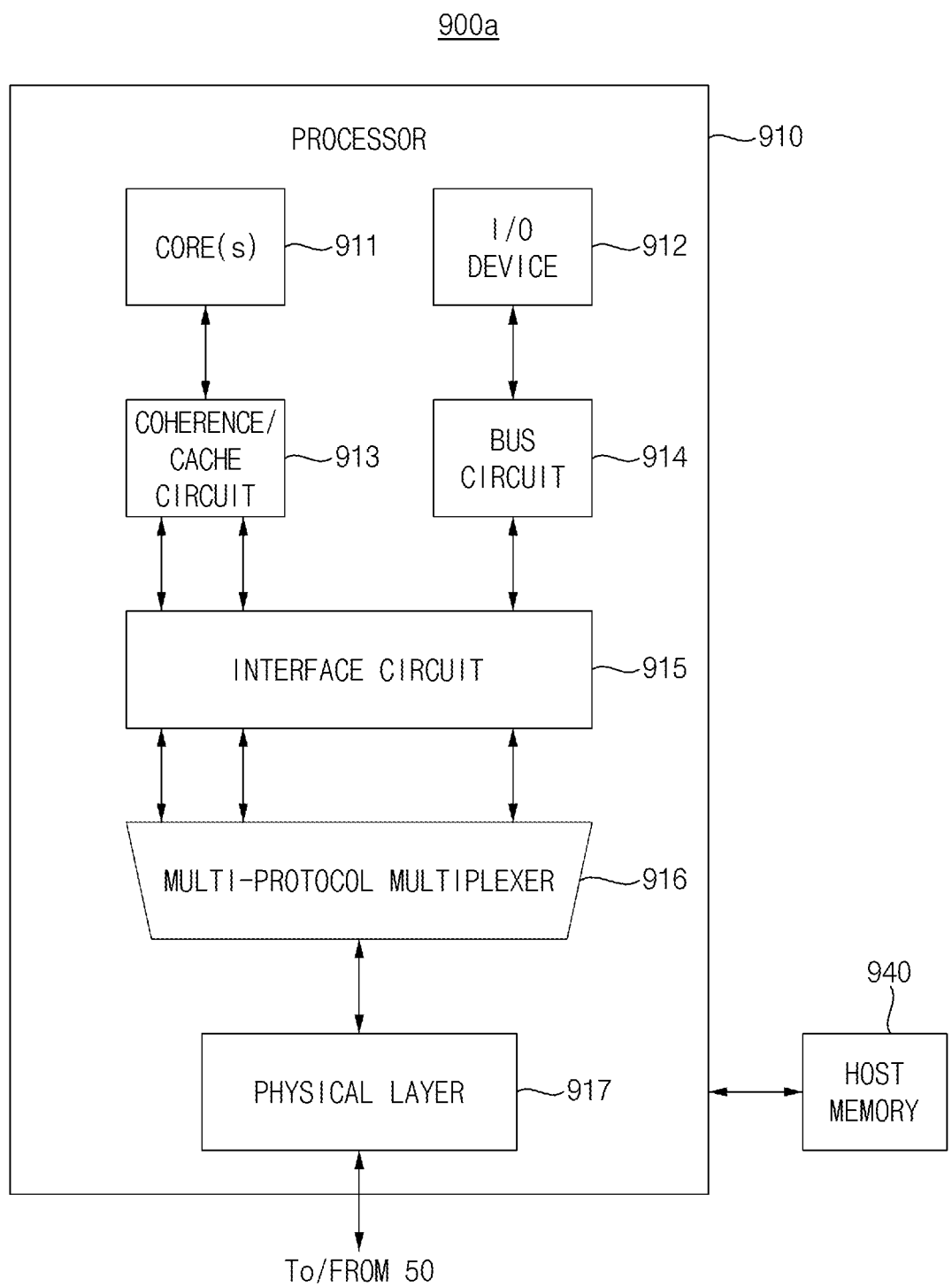
FIG. 19 is a block diagram illustrating one of the plurality hosts in the computing system of FIG. 18 according to some example embodiments.

FIG. 19 is a block diagram illustrating one of the plurality hosts in the computing system of FIG. 18 according to some example embodiments.

In FIG. 19, a configuration of the host 900a from among the plurality hosts 900a, 900b, . . . , 900g and each configuration of the hosts 900b, . . . , 900g may be substantially the same as the configuration of the host 900a.

Referring to FIG. 19, the host 900a may include a processor 910 and a host memory 940.

The processor 910 may be a central processing unit (CPU) of the host 900a. In some embodiments, the processor 910 may be a CXL-based processor. As illustrated in FIG. 19, the processor 910 may be connected to the host memory 940 and may include a physical layer 917, a multi-protocol multiplexer 916, an interface circuit 915, a coherence/cache circuit 913, a bus circuit 914, at least one core 911, and an I/O device 912.

The at least one core 911 may execute an instruction and may be connected to the coherence/cache circuit 913. The coherence/cache circuit 913 may include a cache hierarchy and may be referred to as a coherence/cache logic. As illustrated in FIG. 19, the coherence/cache circuit 913 may communicate with the at least one core 911 and interface circuit 915. For example, the coherence/cache circuit 913 may enable communicate through at least protocols including a coherent protocol and a memory access protocol. In some embodiments, the coherence/cache circuit 913 may include a direct memory access (DMA) circuit. The I/O device 912 may be used to communicate with the bus circuit 914. For example, the bus circuit 914 may be a PCIe logic and the I/O device 912 may be a PCIe I/O device.

The interface circuit 915 may enable communication between components (e.g., the coherence/cache circuit 913 and the bus circuit 914) of the processor 910 and the memory system 1000. In some embodiments, the interface circuit 915 may enable communication between components of the processor 910 and the memory system 1000 according to a plurality of protocols (e.g., the non-coherent protocols, the coherent protocols, and/or the memory access protocols discussed above). For example, the interface circuit 915 may determine one of the plurality of protocols based on messages and data for communication between the components of the processor 910 and the memory system 1000.

The multi-protocol multiplexer 916 may include at least one protocol queue. The interface circuit 915 may be connected to the at least one protocol queue and may transmit and receive messages and/or data to and from the memory system 1000 through the least one protocol queue. In some embodiments, the interface circuit 915 and the multi-protocol multiplexer 916 may be integrally formed into one component. In some embodiments, the multi-protocol multiplexer 916 may include a plurality of protocol queues corresponding respectively to the plurality of protocols supported by the CXL bus 50. In some embodiments, the multi-protocol multiplexer 916 may arbitrate communications of different protocols and provide selected communications the physical layer 917.

Figure 20:
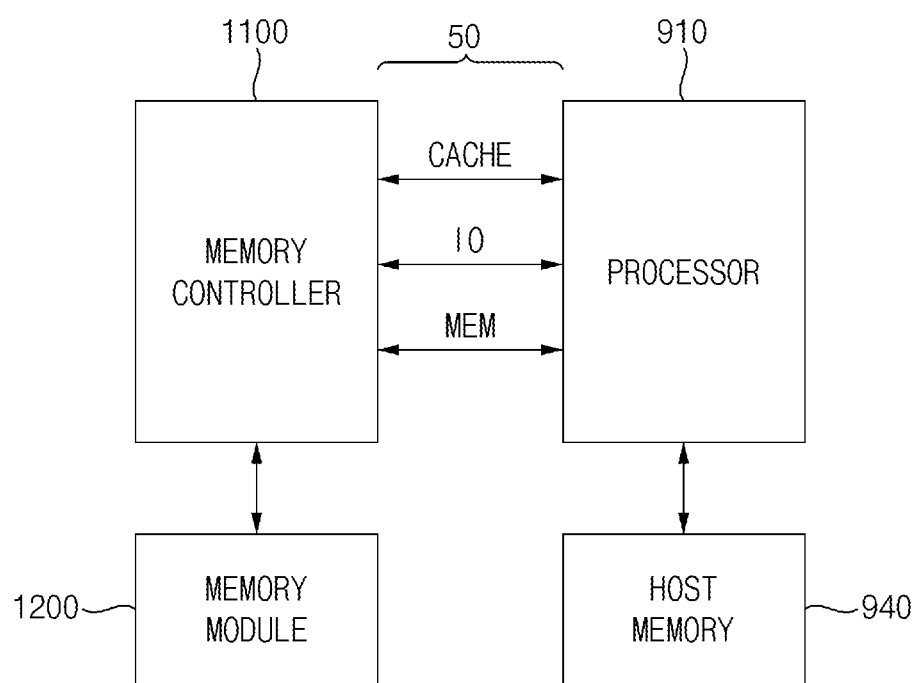
FIG. 20 illustrates an example of a multi-protocol for communication in the computing system of FIG. 18.

FIG. 20 illustrates an example of a multi-protocol for communication in the computing system of FIG. 18.

Referring to FIG. 20, the processor 910 and the memory controller 1100 may communicate with each other based on a plurality of protocols.

According to the above-mentioned CXL examples, the plurality of protocols may include a memory protocol MEM, a coherent protocol CACHE, and a non-coherent protocol IO. The memory protocol MEM may define a transaction from a master to a subordinate and a transaction from the subordinate to the master. The coherent protocol CACHE may define interactions between the memory controller 1100 and the processor 910. For example, an interface of the coherent protocol CACHE may include three channels including a request, a response, and data. The non-coherent protocol IO may provide a non-coherent load/store for I/O devices.

The memory controller 1100 may communicate with the memory module 1200 and the processor 910 may communicate with the host memory 940.

Figure 21:
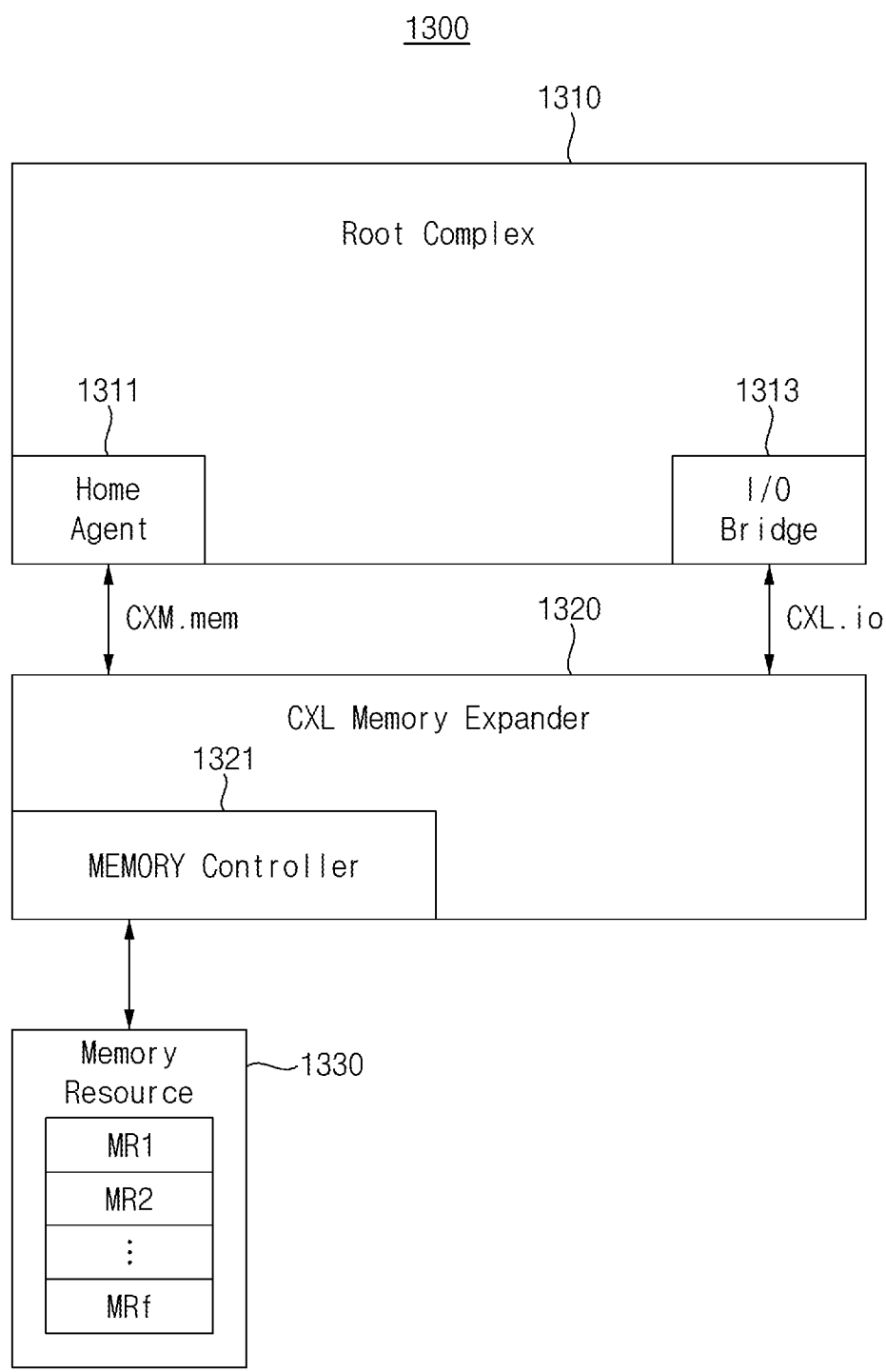
FIG. 21 is an example of a computing system when a memory system according to example embodiments corresponds to a Type 3 memory system defined by a CXL protocol.

FIG. 21 is an example of a computing system when a memory system according to some example embodiments corresponds to a Type 3 memory system defined by a CXL protocol.

Referring to FIG. 21, a computing system 1300 may include a root complex 1310, a CXL memory expander 1320 connected to the root complex 1310, and a memory resource 1330.

The root complex 1310 may include a home agent 1311 and an I/O bridge 1313, and the home agent 1310 may communicate with the CXL memory expander 1320 based on a coherent protocol CXL.mem. The I/O bridge 1313 may communicate with the CXL memory expander 1320 based on a non-coherent protocol, e.g., an I/O protocol CXL.io. In a CXL protocol base, the home agent 1310 may correspond to an agent on a host side that is arranged to solve the entire consistency of the computing system 1300 for a given address.

The CXL memory expander 1320 may include a memory controller 1321 and the memory controller 1321 may employ the memory controller 1100 in FIG. 18.

In addition, the CXL memory expander 1320 may output data to the root complex 1310 via the I/O bridge 1313 based on the I/O protocol CXL.io or the PCIe.

The memory resource 1330 may include a plurality of memory regions MR1, MR2, . . . , MRt, and each of the plurality of memory regions MR1, MR2, . . . , MRt may be implemented as a memory of a various units.

Figure 22:
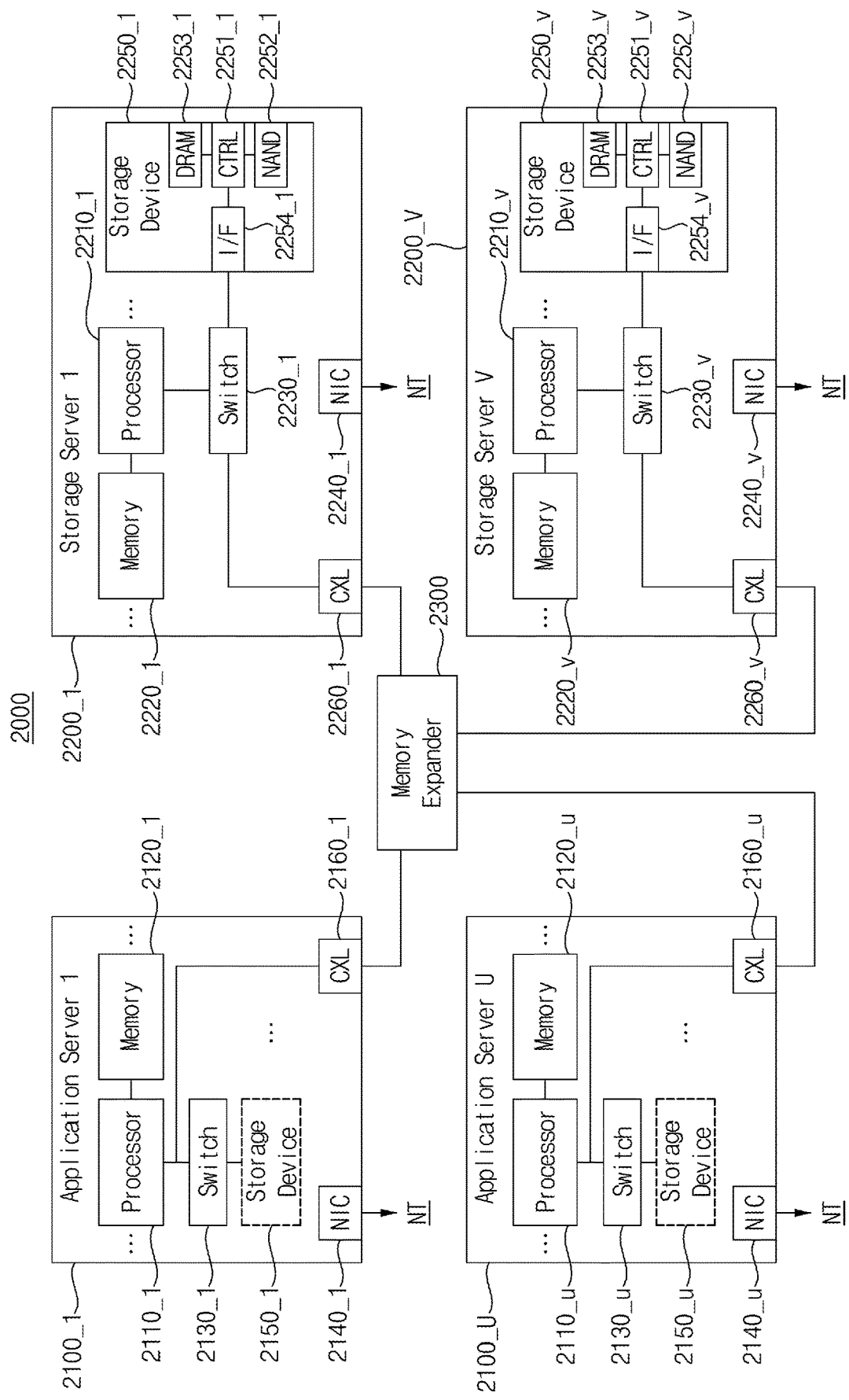
FIG. 22 is a block diagram illustrating a data center including a computing system according to some example embodiments.

FIG. 22 is a block diagram illustrating a data center including a computing system according to some example embodiments.

Referring to FIG. 22, a data center 2000 may be a facility that collects various types of data and provides various services, and may be referred to as a data storage center. The data center 2000 may be a system for operating search engines and databases, and/or may be a computing system used by companies, such as banks, or used by government agencies. The data center 2000 may include application servers 2100_1 to 2100_U and storage servers 2200_1 to 2200_V. The number of the application servers 2100_1 to 2100_U and the number of the storage servers 2200_1 to 2200_V may be variously selected according to some example embodiments, and the number of the application servers 2100_1 to 2100_U and the number of the storage servers 2200_1 to 2200_V m may be different from each other.

Below, for convenience of description, an example of the storage server 2200_1 will be described.

The storage server 2200_1 may include a processor 2210_1, a memory 2220_1, a switch 2230_1, a network interface controller (NIC) 2240_1, a storage device 2250_1 and CXL interface 2260_1. The storage server 2200_V may include a processor 2210_v, a memory 2220_v, a switch 2230_v, a NIC 2240_v, a storage device 2250_v and CXL interface 2260_v.

The processor 2210_1 may control overall operation of the storage server 2200_1. The memory 2220_1 may store various instructions or data under control of the processor 2210_1. The processor 2210_1 may be configured to access the memory 2220_1 to execute various instructions or to process data. In some embodiments, the memory 2220_1 may include at least one of various kind of memory devices such as double data rate synchronous DRAM (DDR SDRAM), high bandwidth memory (HBM), hybrid memory cube (HMC), dual in-line memory module (DIMM), Optane DIMM, and/or non-volatile DIMM.

In some embodiments, the number of the processors 2210_1 included in the storage server 2200_1 and the number of the memories 2220_1 included in the storage server 2200_1 may be variously changed or modified. In some embodiments, the processor 2210_1 and the memory 2220_1 included in the storage server 2200_1 may constitute a processor-memory pair and the number of processor-memory pairs included in the storage server 2200_1 maybe variously changed or modified. In some embodiments, the number of the processors 2210_1 included in the storage server 2200_1 and the number of the memories 2220_1 included in the storage server 2200_1 may be different. The processor 2210_1 may include a single core processor and a multi-core processor.

Under control of the processor 2210_1, the switch 2230_1 may selectively connect the processor 2210_1 and the storage device 2250_1 or may selectively connect the NIC 2240_1, the storage device 2250_1 and the CXL 2260_1.

The NIC 2240_1 may connect the storage server 2200_1 with a network NT. The NIC 2240_1 may include a network interface card, a network adapter, or the like. The NIC 2240_1 may be connected to the network NT through a wired interface, a wireless interface, a Bluetooth interface, or an optical interface. The NIC 2240_1 may include an internal memory, a digital signal processor (DSP), a host bus interface, or the like, and may be connected with the processor 2210_1 or the switch 2230_1 through the host bus interface. The host bus interface may include at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, a compute express link (CXL), an IEEE 1394, a universal serial bus (USB), a secure digital (SD) card interface, a multimedia card (MMC) interface, an embedded MMC (eMMC) interface, a universal flash storage (UFS) interface, an embedded UFS (eUFS) interface, a compact flash (CF) card interface, or the like. In some embodiments, the NIC 2240_1 may be integrated with at least one of the processor 2210_1, the switch 2230_1 and the storage device 2250_1.

Under control of the processor 2210_1, the storage device 2250_1 may store data or may output the stored data. The storage device 2250_1 may include a controller CTRL 2251_1, a nonvolatile memory NAND 2252_1, a DRAM 2253_1 and an interface I/F 2254_1. In some embodiments, the storage device 2250_1 may further include a secure element SE for security or privacy. The storage device 2250_v may include a controller CTRL 2251_v, a nonvolatile memory NAND 2252_v, a DRAM 2253_v and an interface I/F 2254_v. In some embodiments, the storage device 2250_v may further include a secure element SE for security or privacy.

The controller 2251_1 may control overall operation of the storage device 2250_1. The controller 2251_1 may include an SRAM. In response to signals received through the interface 2254_1, the controller 2251_1 may store data in the nonvolatile memory 2252_1 or may output data stored in the nonvolatile memory 2252_1. The controller 2251_1 may be configured to control the nonvolatile memory 2252_1 based on a toggle interface or an ONFI.

The DRAM 2253_1 may be configured to temporarily store data to be stored in the nonvolatile memory 2252_1 and/or data read from the nonvolatile memory 2252_1. The DRAM 2253_1 may be configured to store various data (e.g., metadata and mapping data) used in operation of the controller 2251_1. The interface 2254_1 may provide a physical connection between the controller 2251_1 and the processor 2210_1, the switch 2230_1, or the NIC 2240_1. The interface 2254_1 may be implemented to support direct-attached storage (DAS) manner that allows the direct connection of the storage device 2250_1 through a dedicated cable. The interface 2254_1 may be implemented based on at least one of various above-described interfaces through a host interface bus.

The above components of the storage server 2200_1 are provided as an example, and the present disclosure is not limited thereto. The above components of the storage server 2200_1 may be applied to each of the other storage servers 2200_1 or each of the application servers 2100_1 to 2100_U. In each of the application servers 2100_1 to 2100_U, a storage device 2150_1 may be selectively omitted.

The application server 2100_1 may include a processor 2110_1, a memory 2120_1, a switch 2130_1, a NIC 2140_1, and CXL interface 2160_1. The application server 2100_U may include a processor 2110_u, a memory 2120_u, a switch 2130_u, a NIC 2140_u, and CXL interface 2160_u.

The application servers 2100_1 to 2100_U and the storage servers 2200_1 to 2200_V may communicate with each other through the network NT. The network NT may be implemented using a fiber channel (FC) or an Ethernet. The FC may be a medium used for a relatively high-speed data transmission, and an optical switch that provides high performance and/or high availability may be used. The storage servers 2200_1 to 2200_V may be provided as file storages, block storages or object storages according to an access scheme of the network NT.

In some example embodiments, the network NT may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network NT may be a general network such as the TCP/IP network. For example, the network NT may be implemented according to at least one of protocols such as an FC over Ethernet (FCoE), a network attached storage (NAS), a nonvolatile memory express (NVMe) over Fabrics (NVMe-oF), etc.

In some example embodiments, at least one of the plurality of application servers 2100_1 to 2100_U may be configured to access at least one of the remaining application servers or at least one of the storage servers 2200_1 to 2200_V over the network NT.

For example, the application server 2100_1 may store data requested by s user or a client in at least one of the storage servers 2200_1 to 2200_V over the network NT. Alternatively, the application server 2100_1 may obtain data requested by a user or a client in at least one of the storage servers 2200_1 to 2200_V over the network NT. In this case, the application server 2100_1 may be implemented with a web server, a database management system (DBMS), or the like.

The application server 2100_1 may access a memory 2120_1 or a storage device 2150_1 of the application server 2100_1 or the storage device 2250_1 of the storage server 2200_1 over the network NT. As such, the application server 2100_1 may perform various operations on data stored in the application servers 2100_1 to 2100_U and/or the storage servers 2200_1 to 2200_V. For example, the application server 2100_1 may execute a command for moving or copying data between the application servers 2100_1 to 2100_U and/or the storage servers 2200_1 to 2200_V. The data may be transferred from the storage devices 2250_1 to 2250_v of the storage servers 2200_1 to 2200_V to the memories 2120_1 to 2120_u of the application servers 2100_1 to 2100_U directly or through the memories 2220_1 to 2220_v of the storage servers 2200_1 to 2200_V. For example, the data transferred through the network NT may be encrypted data for security or privacy.

The storage servers 2200_1 to 2200_V and the application servers 2100_1 to 2100_U may be connected with a memory expander 2300 through the CXL interfaces 2260_1 to 2260_v and 2160_1 to 2160_u. The memory expander 2300 may be used as expanded memory of each of the storage servers 2200_1 to 2200_V and the application servers 2100_1 to 2100_U, and/or a virtualized component included therein may communicate with each other through the CXL interfaces 2260_1 to 2260_v and 2160_1 to 2160_u and the memory expander 2300.

The present disclosure may be applied to various electronic devices and systems that include memory modules and memory systems. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, and so on.

While the present disclosure has been particularly shown and described with reference to some examples of embodiments thereof, it will be understood by those of ordinary skill in the art that various changes in form and detail may be made therein without departing from the scope of the present disclosure as defined by the following claims.

What is claimed is:

1. A memory controller configured to control a memory module including a plurality of memory chips, the memory controller comprising:
   an error correction circuit including an encoding circuit; and
   a processor configured to control the error correction circuit,
   wherein the encoding circuit, in a write operation, is configured to:
      divide a user data set into a plurality of data units, each of the plurality of data units including a plurality of data bits;
      identify each of the plurality of data units as one of a plurality of types based on a characteristic of the data bits thereof;
      generate data flags indicating the plurality of types;
      generate data parities by performing a first error correction code (ECC) encoding on the plurality of data units;
      generate flag parities by performing a second ECC encoding on the data flags;
      generate an encoded user data set by using at least one null data unit from among the plurality of data units as a data duplication space for duplicating a valid data unit from among the plurality of data units, the at least one null data unit a data unit in which all or half of the data bits included therein are zero and the valid data unit a data unit in which all or half of the bits included therein are valid;
      generate a codeword set by interleaving the encoded user data set, the data parities, the data flags, the flag parities and a null bit bit-wisely; and
      transmit the codeword set to the memory module.

2. The memory controller of claim 1,
wherein the plurality of types includes a first type, a second type, a third type and a fourth type,
wherein a data unit having the first type, from among the plurality of data units, includes data bits and all of the data bits have a logic low level,
wherein a data unit having the second type, from among the plurality of data units, includes a first sub data unit including upper half bits having a logic low level and a second sub data unit including lower half bits having valid bits,
wherein a data unit having the third type, from among the plurality of data units, includes a third sub data unit including upper half bits and a fourth sub data unit including lower half bits, and the third sub data unit is the same as the fourth sub data unit, and
wherein a data unit having the fourth type is different from the data unit having the first type, the data unit having the second type and the data unit having the third type, respectively.

3. The memory controller of claim 2, wherein the encoding circuit, in response to a first number of the data unit having the first type being greater than zero and a second number of the data unit having the fourth type being greater than zero, is configured to generate the encoded user data set by duplicating at least a portion of the data units having the fourth type in at least a portion of the data units having the first type.

4. The memory controller of claim 3, wherein the encoding circuit, in response to the first number being smaller than the second number, is configured to duplicate at least one data unit corresponding to the first number, from among the data units having the fourth type, in the data unit having the first type.

5. The memory controller of claim 3, wherein the encoding circuit, in response to the first number being equal to or greater than the second number, is configured to duplicate the data units having the fourth type, in a portion or all of the data unit having the first type.

6. The memory controller of claim 3, wherein the encoding circuit, in response to a third number of the data unit having the second type being greater than zero, is configured to duplicate the second sub data unit of the data unit having the second type in the first sub data unit of the data unit having the second type.

7. The memory controller of claim 2, wherein the encoding circuit includes:
   a data duplicator configured to generate the encoded user data set based on the plurality of data units;
   an ECC encoder configured to generate the data parities by performing the first ECC encoding on the plurality of data units;
   a flag encoder configured to generate the data flags based on the plurality of types of the plurality of data units and configured to generate the flag parities by performing a second ECC encoding on the data flags; and
   a bitwise interleaver configured to generate the codeword set by interleaving the encoded user data set, the data parities, the plurality of data flags, the flag parities and the null bit, bi-wisely.

8. The memory controller of claim 7,
wherein the ECC encoder is configured to generate the data parities by performing the first ECC encoding on two data units from among the plurality of data units, respectively, and
wherein the flag encoder is configured to:
   assign a data flag of '01' to a data unit having the first type;
   assign a data flag of '10' to a data unit having the second type;
   assign a data flag of '11' to a data unit having the third type; and
   assign a data flag of '00' to a data unit having the fourth type.

9. The memory controller of claim 8, wherein:
a number of the plurality of data units is equal to 8;
each of the plurality of data units includes 64 data bits;
the data flag includes 16 bits;
the ECC encoder is configured to generate 9-bit data parities with respect to the two data units and generates the data parities of 36 bits in total; and
the flag encoder is configured to generate the flag parities of 5 bits with respect to the data flags of 8 bits.

10. The memory controller of claim 1, wherein the error correction circuit further includes a decoding circuit, and
wherein the decoding circuit, in a read operation, is configured to:
generate the encoded user data set, the data parities, the data flags and the flag parities by deinterleaving the user codeword set bit-wisely, the user codeword set read from the memory module;
generate decoded data flags by performing a first ECC decoding on the data flags based on the flag parities; and
generate a decoded user data set by decoding the encoded user data set based on the data parities and the decoded data flags.

11. The memory controller of claim 10,
wherein the plurality of types includes a first type, a second type, a third type and a fourth type,
wherein a data unit having the first type, from among the plurality of data units, includes data bits and all of the data bits have a logic low level,
wherein a data unit having the second type, from among the plurality of data units, includes a first sub data unit including upper half bits having a logic low level and a second sub data unit including lower half bits having valid bits,
wherein a data unit having the third type, from among the plurality of data units, includes a third sub data unit including upper half bits and a fourth sub data unit including lower half bits, and the third sub data unit is the same as the fourth sub data unit,
wherein a data unit having the fourth type is different from the data unit having the first type, the data unit having the second type and the data unit having the third type, respectively, and
wherein the decoding circuit includes:
a bitwise deinterleaver configured to generate the encoded user data set, the data parities, the plurality of data flags and the flag parities by deinterleaving the read codeword set, bit-wisely;
a flag decoder configured to generate decoded data flags by performing the first ECC decoding on the data flags based on the flag parities; and
a data correction circuit configured to generate the decoded user data set by decoding the encoded user data set based on the data parities and the decoded data flags.

12. The memory controller of claim 11, wherein the data correction circuit includes:
a bitwise OR operator configured to generate an operation data set by performing OR operation on the encoded user data set bit-wisely based on the decoded data flags;
a data de-duplicator configured to generate a recovered data set by eliminating duplications in the operation data set based on the decoded data flags; and
an ECC decoder configured to generate the decoded user data set by performing a second ECC decoding on the recovered user data set based on the data parities.

13. The memory controller of claim 12, wherein, in response to the decoded data flags indicating that a first number of the data unit having the first type is greater than zero and a second number of the data unit having the fourth type is greater than zero,
the bitwise OR operator is configured to generate a first operated data unit by performing OR operation on each of data bits of the data unit having the fourth type and respective one of data bits of a first duplicated data unit obtained by duplicating the data unit having the fourth type, and
the data de-duplicator is configured to recover the data unit having the first type by setting each of the data bits of the first duplicated data unit to a logic low level.

14. The memory controller of claim 12, wherein, in response to the decoded data flags indicating that a number of the data unit having the third type is greater than zero,
the bitwise OR operator is configured to generate a first sub operated data unit and a second sub operated data unit by performing OR operation on each of the upper half bits in the first sub data unit of the data unit having the third type and respective one of the lower half bits in the second sub data unit of the data unit having the third type.

15. The memory controller of claim 12, wherein, in response to the decoded data flags indicating that a number of the data unit having the second type is greater than zero,
the bitwise OR operator is configured to generate an operated sub data unit by performing OR operation on each of lower half bits of the fourth sub data unit of the data unit having the fourth type and respective one of data bits of a duplicated sub data unit obtained by duplicating the fourth sub data unit, and
the data de-duplicator is configured to recover the third sub data unit by setting each of data bits of the duplicated sub data unit to a logic low level.

16. The memory controller of claim 15, wherein:
a number of the plurality of data units corresponds to 8;
each of the plurality of data units includes 64 data bits;
the data flag includes 16 bits;
the data parities include 36 bits;
the decoded flag parities include 10 bits; and
the ECC decoder is configured to perform the second ECC decoding on two data units from among the plurality of data units, based on 9 bits of the 36 bits of the data parities.

17. A memory system comprising:
a memory module that includes a plurality of memory chips; and
a memory controller including an error correction circuit, the memory controller configured to control the memory module,
wherein the memory controller, in a write operation, is configured to:
divide a user data set into a plurality of data units, each of the plurality of data units including a plurality of data bits;
identify each of the plurality of data units as one of a plurality of types based on a characteristic of the data bits thereof;
generate data flags indicating the plurality of types;
generate data parities by performing a first error correction code (ECC) encoding on the plurality of data units;
generate flag parities by performing a second ECC encoding on the data flags;

generate an encoded user data set by using at least one null data unit from among the plurality of data units as a data duplication space for duplicating a valid data unit from among the plurality of data units, the null data unit a data unit in which all or half of included data bits therein are zero and the valid data unit a data unit in which all or half of included data bits therein are valid;

generate a codeword set by interleaving the encoded user data set, the data parities, the data flags, the flag parities and a null bit bit-wisely; and transmit the codeword set to the memory module.

18. The memory system of claim 17, wherein the plurality of types includes a first type, a second type, a third type and a fourth type, wherein a data unit having the first type, from among the plurality of data units, includes data bits and all of the data bits have a logic low level, wherein a data unit having the second type, from among the plurality of data units, includes a first sub data unit including upper half bits having a logic low level and a second sub data unit including lower half bits having valid bits, wherein a data unit having the third type, from among the plurality of data units, includes a third sub data unit including upper half bits and a fourth sub data unit including lower half bits, and the third sub data unit is the same as the fourth sub data unit, wherein a data unit having the fourth type is different from the data unit having the first type, the data unit having the second type and the data unit having the third type, respectively, and wherein the memory controller, in response to each of a first number of the data unit having the first type and a second number of the data unit having the fourth type being greater than zero, is configured to generate the encoded user data set by duplicating at least a portion of the data units having the fourth type in at least a portion of the data units having the first type.

19. The memory system of claim 17, wherein the error correction circuit further includes a decoding circuit, and wherein the decoding circuit, in a read operation, is configured to:

generate the encoded user data set, the data parities, the data flags and the flag parities by deinterleaving the user codeword set bit-wisely, read from the memory module;

generate decoded data flags by performing a first ECC decoding on the data flags based on the flag parities; and generate a decoded user data set by decoding the encoded user data set based on the data parities and the decoded data flags.

20. A memory controller configured to control a memory module including a plurality of memory chips, the memory controller configured to control the memory module by communicating with one or more host through a compute express link (CXL) interface, the memory controller comprising:

an error correction circuit including an encoding circuit and a decoding circuit; and a processor configured to control the error correction circuit, wherein the encoding circuit, in a write operation, is configured to:

divide a user data set into a plurality of data units, each of the plurality of data units including a plurality of data bits;

identify each of the plurality of data units as one of a plurality of types based on a characteristic of the data bits thereof;

generate data flags indicating the plurality of types;

generate data parities by performing a first error correction code (ECC) encoding on the plurality of data units;

generate flag parities by performing a second ECC encoding on the data flags;

generate an encoded user data set by using at least one null data unit from among the plurality of data units as a data duplication space for duplicating a valid data from among the plurality of data units, the null data unit a data unit in which all or half of included data bits therein are zero and the valid data unit a data unit in which all or half of included data bits therein are valid;

generate a codeword set by interleaving the encoded user data set, the data parities, the data flags, the flag parities and a null bit bit-wisely; and transmit the codeword set to the memory module, wherein the decoding circuit, in a read operation, is configured to:

generate the encoded user data set, the data parities, the data flags and the flag parities by deinterleaving the user codeword set bit-wisely, read from the memory module;

generate decoded data flags by performing a first ECC decoding on the data flags based on the flag parities; and generate a decoded user data set by decoding the encoded user data set based on the data parities and the decoded data flags.

* * * * *